US012648418B2

(12) United States Patent
Subbaiyan et al.

(10) Patent No.: US 12,648,418 B2
(45) Date of Patent: Jun. 2, 2026

(54) INTEGRATED ATMOSPHERIC PLASMA TREATMENT STATION IN PROCESSING TOOL

(71) Applicant: Lam Research Corporation, Fremont, CA (US)

(72) Inventors: Navaneetha Krishnan Subbaiyan, Portland, OR (US); Patrick Little, West Linn, OR (US); Daniel Mark Dinneen, Knocksentry (IE); Shantinath Ghongadi, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 311 days.

(21) Appl. No.: 18/556,978

(22) PCT Filed: Apr. 20, 2022

(86) PCT No.: PCT/US2022/025615
§ 371 (c)(1),
(2) Date: Oct. 24, 2023

(87) PCT Pub. No.: WO2022/231922
PCT Pub. Date: Nov. 3, 2022

(65) Prior Publication Data
US 2024/0213089 A1 Jun. 27, 2024

Related U.S. Application Data

(60) Provisional application No. 63/201,392, filed on Apr. 27, 2021.

(51) Int. Cl.
H01L 21/768 (2006.01)
C25D 7/12 (2006.01)
(Continued)

(52) U.S. Cl.
CPC ........ H01L 21/76862 (2013.01); C25D 7/123 (2013.01); H01J 37/32376 (2013.01);
(Continued)

(58) Field of Classification Search
CPC ........ H01J 37/32853; H01L 21/02057–02074; H01L 21/02315; H01L 21/02252; H01L 21/0234; H01L 2224/80013
See application file for complete search history.

(56) References Cited

U.S. PATENT DOCUMENTS 9,472,377 B2    10/2016    Opocensky et al.
2003/0213561 A1    11/2003    Selwyn et al.
(Continued)

FOREIGN PATENT DOCUMENTS

JP        4593287 B2    12/2010
KR    20030063380 A    7/2003
(Continued)

OTHER PUBLICATIONS

International Search Report and Written Opinion dated Aug. 11, 2022 in Application No. PCT/US2022/025615.
(Continued)

*Primary Examiner* — Amar Movva
(74) *Attorney, Agent, or Firm* — Weaver Austin Villeneuve & Sampson LLP

(57)    ABSTRACT

An atmospheric plasma treatment station is integrated in a semiconductor process tool. The atmospheric plasma treatment station directly interfaces with a deposition chamber of the semiconductor process tool without adding to the footprint or form factor of the semiconductor process tool. The atmospheric plasma treatment station includes a movable atmospheric plasma source such as a linear head for scanning across a surface of a substrate. The atmospheric plasma treatment station provides an enclosed space in a controlled
(Continued)

environment with non-reactive gas flowing through the enclosed space. Process gases may be supplied to the linear head based on a surface condition of the substrate being treated.

20 Claims, 12 Drawing Sheets

(51) Int. Cl.
  *H01J 37/32* (2006.01)
  *H01L 21/02* (2006.01)
  *H01L 21/67* (2006.01)
  *H01L 21/677* (2006.01)

(52) U.S. Cl.
  CPC .... *H01J 37/3244* (2013.01); *H01J 37/32825* (2013.01); *H01J 37/32853* (2013.01); *H01L 21/02057* (2013.01); *H01L 21/02252* (2013.01); *H01L 21/02315* (2013.01); *H01L 21/0234* (2013.01); *H01L 21/67167* (2013.01); *H01L 21/67745* (2013.01); *H01L 21/76873* (2013.01); *H01L 21/02068* (2013.01); *H01L 2224/80013* (2013.01)

(56) References Cited

U.S. PATENT DOCUMENTS

| | | |
|---|---|---|
| 2004/0050685 A1 | 3/2004 | Yara et al. |
| 2005/0167404 A1 | 8/2005 | Yamazaki |
| 2006/0278254 A1 | 12/2006 | Jackson |
| 2010/0108491 A1 | 5/2010 | Yoon et al. |
| 2010/0317198 A1 | 12/2010 | Antonelli et al. |
| 2011/0073256 A1 | 3/2011 | Yamazaki |
| 2015/0376792 A1 | 12/2015 | Spurlin et al. |
| 2016/0111344 A1 | 4/2016 | Opocensky et al. |
| 2019/0088451 A1 | 3/2019 | Schulte et al. |
| 2020/0381262 A1 | 12/2020 | Trojan et al. |

FOREIGN PATENT DOCUMENTS

| | | |
|---|---|---|
| KR | 20050095877 A | 10/2005 |
| KR | 20080063462 A | 7/2008 |
| KR | 20120034100 A | 4/2012 |
| TW | 202002066 A | 1/2020 |

OTHER PUBLICATIONS

International Preliminary Report on Patentability dated Nov. 9, 2023, in PCT Application No. PCT/US2022/025615.

KR Office Action dated Apr. 4, 2022, in application No. KR1020150092101 with English translation.

KR Office Action dated Jul. 27, 2022 in Application No. KR10-2022-0081323 with English translation.

KR Office Action dated Oct. 21, 2021, in application No. KR20150092101 with English translation.

US Office Action, dated Feb. 2, 2016, issued in U.S. Appl. No. 14/320,171.

U.S. Restriction Requirement dated Oct. 2, 2015 in U.S. Appl. No. 14/320,171.

KR Office Action dated Sep. 25, 2025 in KR Application No. 10-2022-7046057, with English Translation.

TW Office Action and Search Report dated Oct. 2, 2025 in TW Application No. 111115750, with English Translation.

TW Office Action dated Mar. 6, 2026 in TW Application No. 111115750, with English Translation.

200

Deposit metal seed layer on a substrate — 210

Rinse or wet the substrate — 220

Transfer the substrate to electroplating or electroless deposition system — 230

Electrodeposit metal on the substrate — 240

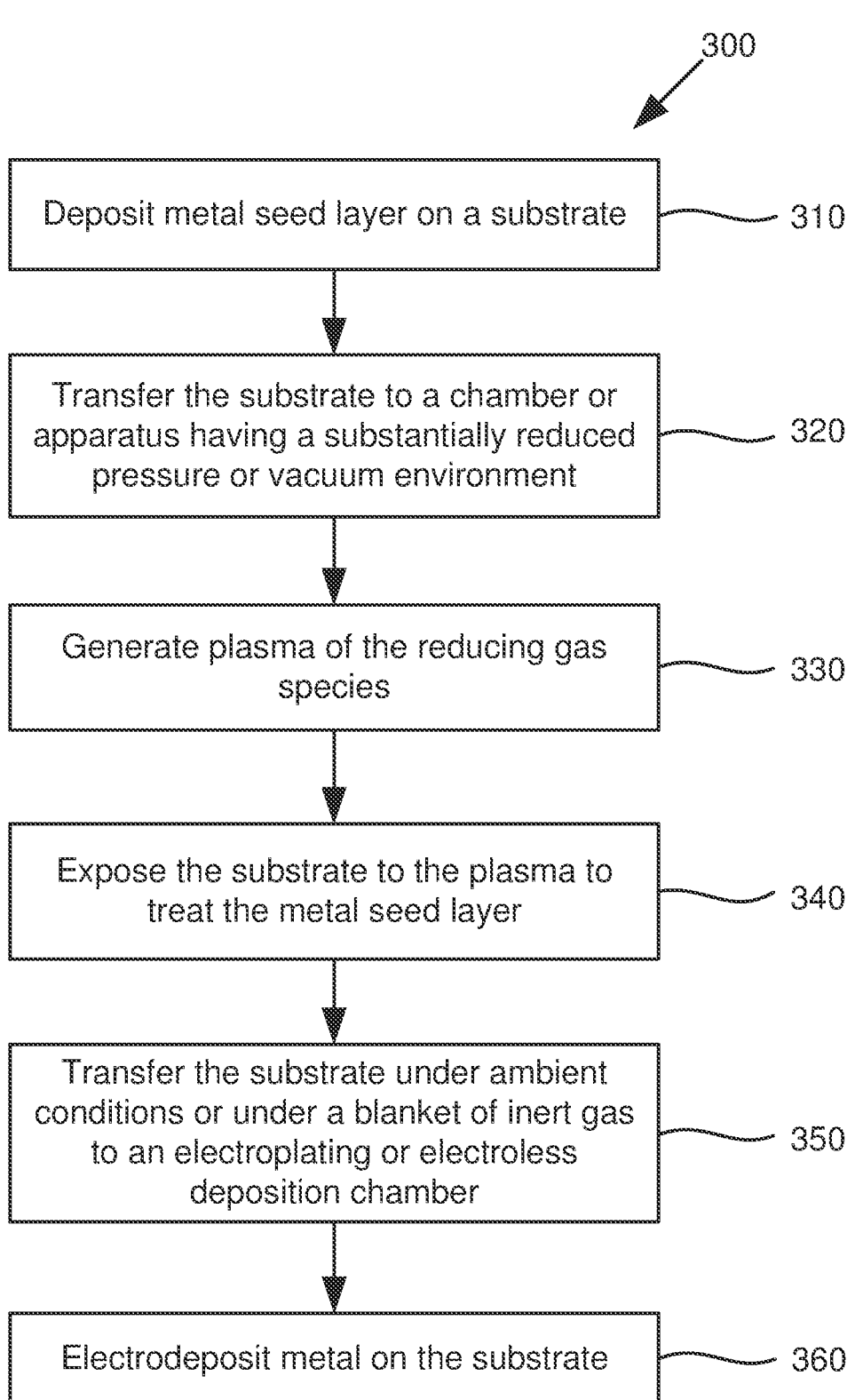

300

Deposit metal seed layer on a substrate — 310

Transfer the substrate to a chamber or apparatus having a substantially reduced pressure or vacuum environment — 320

Generate plasma of the reducing gas species — 330

Expose the substrate to the plasma to treat the metal seed layer — 340

Transfer the substrate under ambient conditions or under a blanket of inert gas to an electroplating or electroless deposition chamber — 350

Electrodeposit metal on the substrate — 360

*FIG. 3*

INTEGRATED ATMOSPHERIC PLASMA TREATMENT STATION IN PROCESSING TOOL

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Fabrication of semiconductor devices, such as integrated circuits, is a multi-step process. Various processes in semiconductor device fabrication commonly require pretreatment, or cleaning of substrates prior to deposition of material on the surfaces of substrates. In some instances, oxides, organic impurities, or other contaminants may present challenges to deposition of materials. In some instances, a surface condition of a substrate such as its wettability may need to be adjusted prior to deposition of materials.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is an apparatus for processing semiconductor substrates. The apparatus includes one or more cassettes for receiving a semiconductor substrate, a deposition chamber for depositing materials on the semiconductor substrate, and an atmospheric plasma treatment station for exposing the semiconductor substrate to an atmospheric plasma prior to deposition in the deposition chamber. The atmospheric plasma treatment station includes an enclosed controlled environment for receiving the semiconductor substrate, the enclosed controlled environment having an inert gas flow, a track positioned above the semiconductor substrate within the enclosed controlled environment, and a linear head movable along the track, where the linear head is configured to direct the atmospheric plasma to specified regions of the semiconductor substrate.

In some implementations, the atmospheric plasma treatment station further comprises a substrate support having one or more heating elements for heating the semiconductor substrate. The semiconductor substrate may be heated to a temperature greater than about 50° C. during exposure to the atmospheric plasma. In some implementations, the apparatus further includes one or more gas lines for supplying one or more process gases to the linear head, and an RF power supply for generating atmospheric plasma of the one or more process gases in the linear head. The one or more process gases may include oxygen, hydrogen, water, nitrogen, ammonia, hydrazine, carbon monoxide, carbon dioxide, diborane, methane, carbon tetrafluoride, octafluorobutane, nitrogen trifluoride, sulfur hexafluoride, helium, argon, neon, krypton, xenon, radon, or combinations thereof. In some implementations, the apparatus further includes a controller configured with instructions for performing the following operations: scan an entirety of a surface of the semiconductor substrate with the atmospheric plasma, and transfer the semiconductor substrate from the atmospheric plasma treatment station to the deposition chamber in reduced queue time. The controller may be further configured with instructions to scan the entirety of the surface of the semiconductor substrate is configured with instructions to perform the following operations: expose the semiconductor substrate to the atmospheric plasma having a first gas composition, and expose the semiconductor substrate to the atmospheric plasma having a second gas composition. The atmospheric plasma having the first gas composition may include an oxygen plasma, and the atmospheric plasma having the second gas composition may include a hydrogen plasma. In some implementations, the controller is further configured with instructions to perform the following operations: expose the semiconductor substrate to the atmospheric plasma to perform one of the following: reduce metal oxides to metal on the semiconductor substrate, remove organic impurities on the semiconductor substrate, change a wettability of the semiconductor substrate, change an adhesion of the surface of the semiconductor substrate, and change a surface roughness of the semiconductor substrate. In some implementations, the semiconductor substrate is supported on a movable substrate support, where the linear head is configured to scan a surface of the semiconductor substrate with the atmospheric plasma by moving the semiconductor substrate using the movable substrate support. In some implementations, the linear head is configured to scan a surface of the semiconductor substrate with the atmospheric plasma by moving the linear head along the track. In some implementations, the inert gas flow includes an inert gas species of nitrogen, helium, argon, neon, krypton, xenon, radon, or combinations thereof. In some implementations, the deposition chamber is an electroless deposition chamber. In some implementations, the enclosed controlled environment is an oxygen-free environment, and the enclosed controlled environment is free of exposure to vacuum pressures. In some implementations, the apparatus further includes one or more gas lines for delivering one or more process gases to the linear head, and a controller configured with instructions for performing the following operations: receive an indication providing a surface condition of the semiconductor substrate, adjust a gas composition of the one or more process gases to be delivered to the linear head, generate the atmospheric plasma of the one or more process gases in the linear head, and scan the semiconductor substrate by exposure to the atmospheric plasma to treat the surface condition of the semiconductor substrate prior to deposition in the deposition chamber.

Also provided herein is a method of treating a surface condition of a semiconductor substrate with an atmospheric plasma. The method includes receiving a semiconductor substrate in a semiconductor process tool including an atmospheric plasma treatment station and a deposition chamber and transferring the semiconductor substrate to the deposition chamber. Transferring the semiconductor substrate to the deposition chamber includes exposing the semiconductor substrate to an atmospheric plasma in the atmospheric plasma treatment station prior to deposition in the deposition chamber, where the atmospheric plasma treatment station includes an enclosed controlled environment having an inert gas flow, a track positioned above the semiconductor substrate within the enclosed controlled environment, and a linear head movable along the track, where the linear head is configured to direct the atmospheric plasma to specified regions of the semiconductor substrate.

In some implementations, transferring the semiconductor substrate to the deposition chamber includes moving the semiconductor substrate from the atmospheric plasma treatment station to an electroless deposition chamber. In some implementations, the method further includes receiving an indication providing a surface condition of the semiconductor substrate, adjusting a gas composition of one or more process gases to be delivered to the linear head, generating the atmospheric plasma of the one or more process gases in the linear head, and scanning the semiconductor substrate by exposure to the atmospheric plasma to treat the surface condition of the semiconductor substrate prior to deposition in the deposition chamber. The one or more process gases may include oxygen, argon, hydrogen, nitrogen, ammonia, carbon monoxide, diborane, or combinations thereof, where the inert gas flow may include an inert gas species of nitrogen, helium, argon, neon, krypton, xenon, radon, or combinations thereof. In some implementations, the enclosed controlled environment is an oxygen-free environment, and the enclosed controlled environment is free of exposure to vacuum pressures.

BRIEF DESCRIPTION OF THE DRAWINGS

FIG. 3 shows a flow diagram illustrating an example method of treating a substrate having a metal seed layer using a dry technique and electrodepositing metal on the metal seed layer.

DETAILED DESCRIPTION

Figure 1A:
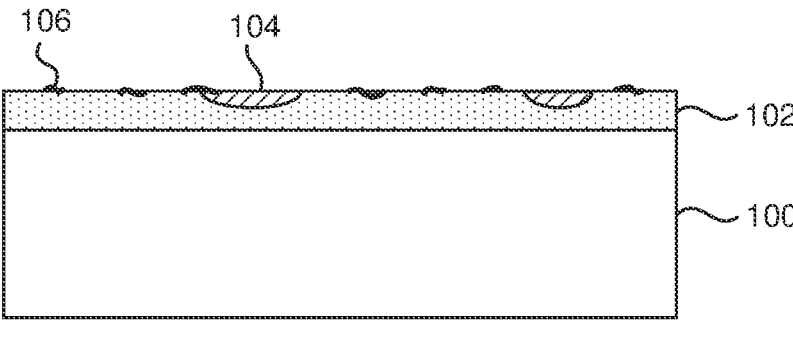
FIGS. 1A-1D show cross-sectional schematic illustrations of various processing stages for treating a semiconductor substrate prior to deposition.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards, magnetic recording media, magnetic recording sensors, mirrors, optical elements, micro-mechanical devices and the like.

Semiconductor manufacturing processes often result in impurities, contaminants, oxidation, surface defects, or other undesirable surface conditions prior to deposition of materials. If left untreated, these undesirable surface conditions may lead to non-uniform deposition, yield loss, or even damage to the semiconductor device.

One issue that can be problematic is the presence of organic impurities. Such organic impurities may be left behind on the substrate after etching, polishing (e.g., CMP), cleaning, deposition, or other device fabrication process. In some cases, the organic impurities can lead to device contamination or interfacial defects. Another issue that can be problematic during deposition is the presence of oxide (e.g., metal oxide) on the surface of the substrate. Often, a substrate that is to undergo plating is provided with a conductive seed layer. This seed layer, which is typically metal, can quickly become oxidized when exposed to an oxygen-containing atmosphere. The oxide can interfere with the plating process, and can be especially problematic when plating metal into recessed features. In many cases, oxide on the seed layer will lead to formation of unwanted voids.

Incoming wafers received by a process tool typically need surface pretreatment prior to deposition. For instance, a substrate may be subjected to a reducing treatment to remove any oxide and/or organic impurities present on the surface of the substrate. Some reducing treatments may be liquid-based chemistries and some reducing treatments may be plasma-based chemistries. Various pretreatment processes may be used, for example, as described in any of the following U.S. Patents and Patent Publications, each of which is herein incorporated by reference in its entirety: U.S. Patent Publication No. 2014/0199497, titled "METHODS FOR REDUCING METAL OXIDE SURFACES TO MODIFIED METAL SURFACES"; U.S. Pat. No. 9,070, 750, titled "METHODS FOR REDUCING METAL OXIDE SURFACES TO MODIFIED METAL SURFACES USING A GASEOUS REDUCING ENVIRONMENT"; U.S. Pat. No. 9,469,912, titled "PRETREATMENT METHOD FOR PHOTORESIST WAFER PROCESSING"; and U.S. Pat. No. 9,472,377, titled "METHOD AND APPARATUS FOR CHARACTERIZING METAL OXIDE REDUCTION."

FIGS. 1A-1D show cross-sectional schematic illustrations of various processing stages for treating a semiconductor substrate prior to deposition. In FIG. 1A, a semiconductor substrate 100 includes a seed layer 102. In some implementations, the seed layer 102 is a metal seed layer such as a copper seed layer or cobalt seed layer. A thickness of the seed layer 102 may be less than about 100 Å or less than about 50 Å. It is possible that oxidation of the seed layer 102 may occur by exposure to air or other oxygen-containing environment. Oxides 104 such as metal oxides may form on a surface of the semiconductor substrate 100. The presence of oxides 104 may present significant challenges especially for electrodeposition processes. First, an oxidized surface is difficult to plate on, and non-uniform plating may result. Second, voids may form that may make portions of the seed layer 102 unavailable to support plating. Third, plating bulk metal on top of the oxides 104 can lead to adhesion or delamination problems. In addition to the problems presented by the oxides 104, it is possible that impurities 106 may form on the surface of the semiconductor substrate 100. Impurities 106 may come from particles in a dirty chamber, etch byproducts, deposition byproducts, residues, or other contaminants. Such impurities 106 may include organic impurities. Generally, it is known that impurities 106 can weaken or kill device performance.

Figure 1B:
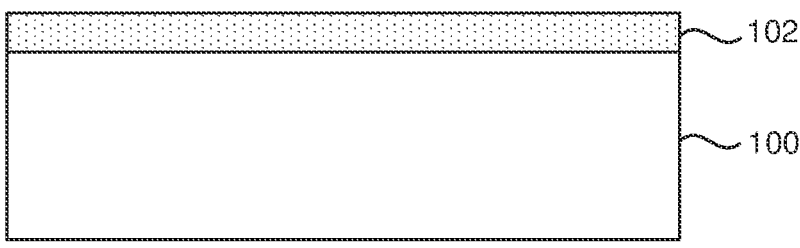

In FIG. 1B, a surface pretreatment is performed on the semiconductor substrate 100 to remove the oxides 104 and the impurities 106. The surface pretreatment process often involves exposing the semiconductor substrate 100 to reducing conditions. For instance, the reducing conditions may be established by exposing the semiconductor substrate 100 to liquid, gas, and/or plasma that includes reducing chemistry. One method commonly used to pretreat a substrate prior to electrodeposition involves exposing the semiconductor substrate 100 to hydrogen-containing plasma. The pretreatment conditions may be sufficient to remove the oxides 104 and the impurities 106. The pretreatment conditions may include a variety of processing variables including, but not limited to, composition and flow rate of the gas/plasma/liquid, duration of exposure, temperature at which the substrate is maintained, power level used to generate plasma (if any), duty cycle used to generate plasma (if any), frequency used to generate plasma (if any), pressure, etc. The surface pretreatment ordinarily takes place in an apparatus separate from an electroplating or electroless plating apparatus, though in some cases the surface pretreatment may take place in a module included with the electroplating or electroless plating apparatus.

Figure 1C:
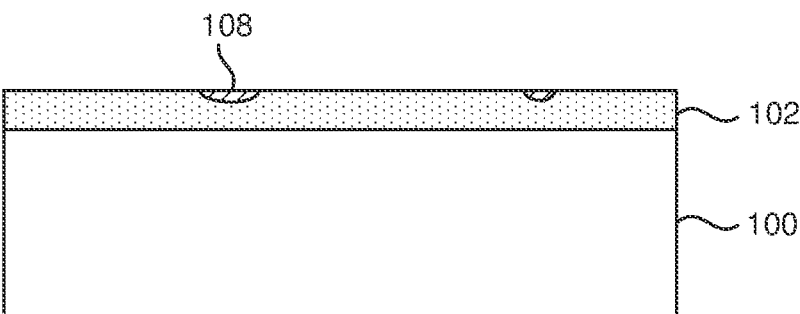

After surface pretreatment, it is possible that the semiconductor substrate 100 may be exposed to conditions that cause recontamination or reoxidation. As shown in FIG. 1C, reoxidation may result in oxides 108 forming on the seed layer 102 after surface pretreatment and prior to deposition. In some instances, the semiconductor substrate 100 may be rinsed and dried either during or after the surface pretreatment to cause the semiconductor substrate 100 to reoxidize. In other instances, the semiconductor substrate 100 may be transferred to a deposition chamber (e.g., electroplating or electroless plating apparatus) under ambient conditions that cause the semiconductor substrate 100 to rapidly reoxidize. In some other instances, a module such as a vacuum plasma module (VPM) may slowly fill up with contaminant particles that can drop down and contaminate the semiconductor substrate 100 when plasma is turned off. Though vacuum plasma modules are generally effective in reducing oxides 104 and clearing away impurities 106 to improve deposition/nucleation on the seed layer 102, vacuum plasma modules are expensive and integration of VPMs into an electroplating or electroless plating apparatus would be costly and add to a large footprint/form factor.

Figure 1D:
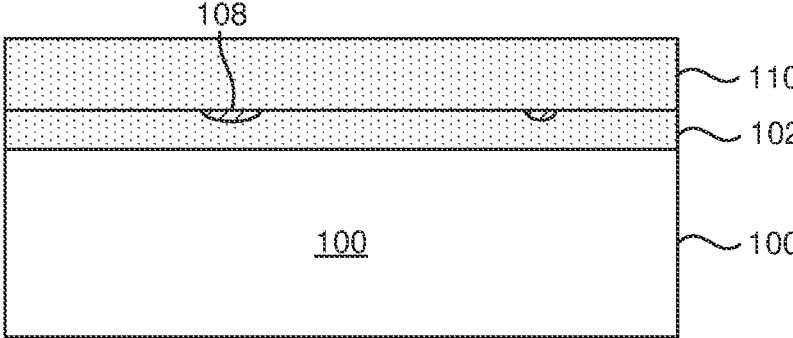

FIG. 1D shows the semiconductor substrate 100 after bulk deposition of material 110 on the seed layer 102. The material 110 may be deposited on the seed layer 102 by any suitable deposition process such as physical vapor deposition (PVD), chemical vapor deposition (CVD), atomic layer deposition (ALD), electroplating, or electroless plating. The oxides 108 may limit deposition of the material 110 on the seed layer. By way of an example, oxidized surfaces generally do not support electron transfer for autocatalytic chemical reduction in electroless plating, and oxidized surfaces often result in voiding and non-uniform plating in electroplating processes.

Figure 2:
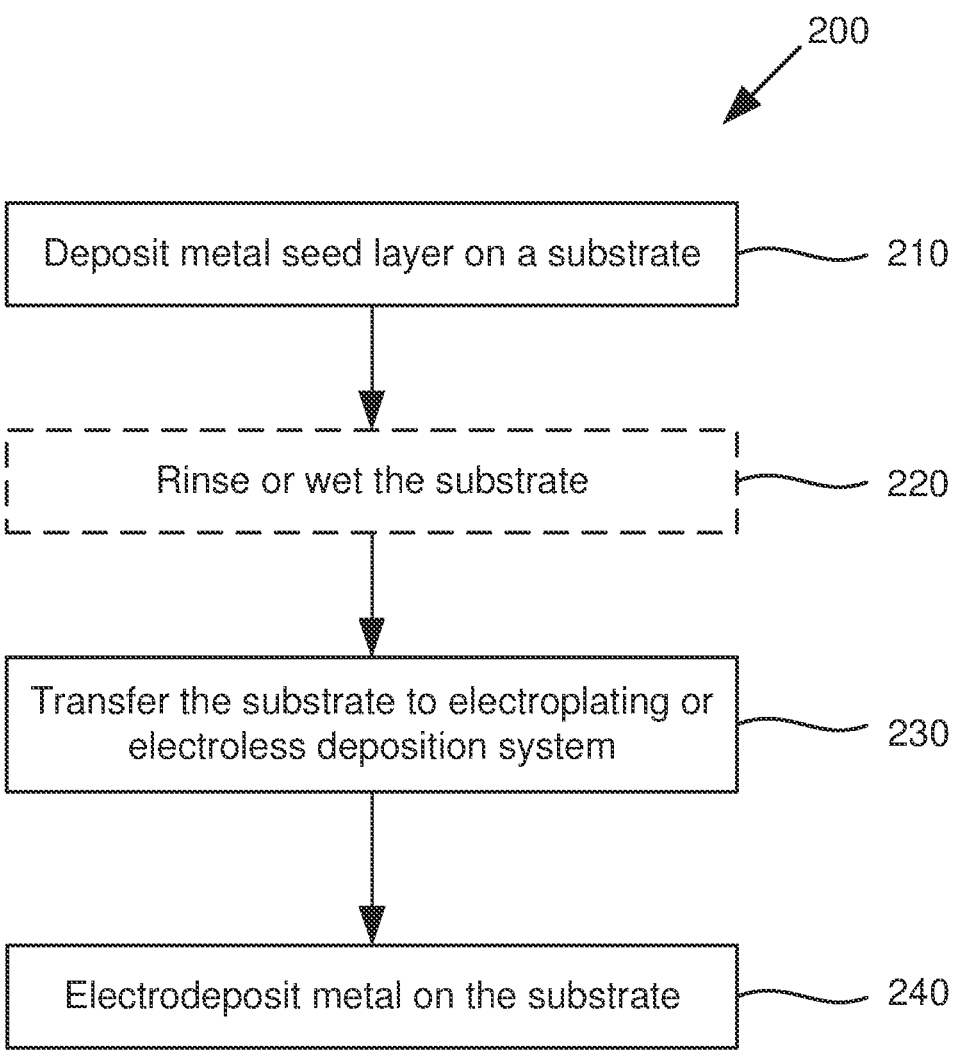
FIG. 2 shows a flow diagram illustrating an example method of treating a substrate having a metal seed layer using a wet technique and electrodepositing metal on the metal seed layer.

FIG. 2 shows a flow diagram illustrating an example method of treating a substrate having a metal seed layer using a wet technique and electrodepositing metal on the metal seed layer. The process 200 begins at block 210 where a metal seed layer is deposited on a substrate using a suitable deposition technique such as PVD. In some implementations, the metal seed layer may have an average thickness of about 15 Å to about 100 Å or larger. The substrate may include recessed features such as trenches. At block 220, the substrate may be rinsed or wetted with a solution containing a reducing agent. For example, the reducing agent may include a reducing compound or mixture of multiple reducing compounds for reducing metal oxides to metal. Additionally or alternatively, the substrate may be rinsed with de-ionized water and dried. At block 230, the substrate is transferred to an electroplating or electroless deposition system. During the transfer, the metal seed layer may be exposed to ambient conditions such that the metal seed layer may rapidly oxidize. In some implementations, the duration of this exposure may be anywhere between about 1 minute and about 4 hours, between about 15 minutes and about 1 hour, or more. Proceeding to block 240, a bulk layer of metal is electrodeposited on the substrate. In electroplating, the substrate with the metal seed layer may be immersed in an electroplating bath containing positive ions of metal and associated anions in an acid solution. Alternatively, in electroless plating, the substrate may be exposed to a reducing chemical bath that causes nucleation of metal on the metal seed layer.

FIG. 3 shows a flow diagram illustrating an example method of treating a substrate having a metal seed layer using a dry technique and electrodepositing metal on the metal seed layer. The process begins at block 310 where a metal seed layer is deposited on a substrate using a suitable deposition technique such as PVD. In some implementations, the metal seed layer may have an average thickness of about 15 Å to about 100 Å or larger. The substrate may include recessed features such as trenches. At block 320, the substrate is transferred to a chamber or apparatus having a substantially reduced pressure or vacuum environment. A substantially reduced pressure can be between about 0.1 Torr and about 5 Torr. The chamber or apparatus can include a reducing gas species such as hydrogen ($H_2$), ammonia ($NH_3$), carbon monoxide (CO), diborane ($B_2H_6$), sulfite compounds, carbon and/or hydrocarbons, phosphites, and/or hydrazine ($N_2H_4$). The chamber or apparatus serves as a pretreatment module to clean the surface of the substrate of contaminants or oxides. During the transfer, the substrate may be exposed to ambient conditions that may cause the surface of the metal seed layer to oxidize. Proceeding to block 330, plasma is generated of the reducing gas species. The plasma may include radicals, ions, neutrals of the reducing gas species to reduce oxides and generate a pure metallic surface. The plasma may be a direct or indirect plasma (e.g., remote plasma). The process continues at block

340 where the substrate is exposed to the plasma to treat the metal seed layer. The plasma may contact the metal seed layer to remove metal oxides from the surface of the metal seed layer. The plasma may additionally or alternatively remove organic impurities left behind from the as-deposited metal seed layer. The plasma may additionally or alternatively change the surface roughness of the metal seed layer. Other surface conditions of the metal seed layer may be adjusted by exposure to the plasma. At block 350, the substrate is transferred under ambient conditions or under a blanket of inert gas to an electroplating or electroless deposition chamber. In some implementations, the duration of this transfer may be anywhere between about 1 minute and about 4 hours, between about 15 minutes and about 1 hour, or more. Exposure to ambient conditions may potentially lead to reoxidation. In some implementations, the substrate may be transferred under a blanket of inert gas to minimize reoxidation. At block 360, metal is electrodeposited on the substrate. Bulk metal may be deposited on the metal seed layer by electroplating or electroless plating.

Many strategies exist for treatment of substrates prior to deposition. Wet techniques may involve an aqueous solution having a reducing agent to reduce oxides, but the aqueous solution may be acidic or contain other chemical reagents that etch or dissolve oxides, resulting in voids in the seed layer. In addition, wet techniques may leave residue that require additional rinsing and drying operations that potentially reoxidize the seed layer. Dry techniques may involve thermal forming gas anneal to reduce oxides, but such techniques may not be as effective as plasma-based techniques and ordinarily require temperatures higher than 150° C., resulting in damage to the seed layer and increased voiding. Other dry techniques may involve the use of plasmas generated in vacuum or substantially reduced pressures to reduce oxides and otherwise treat surface defects and contaminants, but such plasmas add substantial costs and utilize substantially high temperatures that can damage a thin metal seed layer. Moreover, generating these plasmas require relatively long times for the chamber to be pumped down to vacuum or substantially reduced pressures, thereby adding to queue time and reducing throughput. These plasmas are often generated in VPMs that are expensive and add a large footprint/form factor regardless of whether the vacuum plasma modules are standalone equipment or incorporated in existing process tools.

Atmospheric plasmas offer an alternative to vacuum plasmas. A wide range of atmospheric plasma technologies exist including electric arc, corona discharge, dielectric barrier discharge, and plasma jets. Atmospheric plasma technologies are generally less expensive than vacuum-based plasma technologies. Thus, atmospheric plasmas can reduce the cost of production equipment and extend to a wide range of plasma technologies. Challenges exist to designing an atmospheric plasma treatment station to effectively treat surfaces of substrates and integrating the atmospheric plasma treatment station in semiconductor processing tools.

Atmospheric Plasma Pretreatment Station

The present disclosure relates to a process tool having an integrated atmospheric plasma treatment station and a deposition chamber. The atmospheric plasma treatment station may be configured to treat or control various surface conditions of substrates prior to deposition, where the surface conditions can include but are not limited to: surface defects, oxides, organic impurities, roughness, wettability, adhesion, uniformity, and electrical bias. In some implementations, a controlled environment is provided in an enclosed space in the atmospheric plasma treatment station, where the controlled environment includes a positive pressure flow of non-reactive gas (e.g., inert gas). The atmospheric plasma treatment station further includes a linear head mounted above a substrate. One or both of the linear head and the substrate is movable so that the linear head is positioned to direct atmospheric plasma to specified regions of the substrate. That way, certain regions of the substrate may be treated or an entirety of the substrate may be scanned. In some implementations, the linear head is coupled to a robot arm mounted on a track so that the linear head is movable relative to the substrate. In some implementations, the substrate is supported on a movable substrate support so that the substrate is movable relative to the linear head. Gas lines may deliver process gases to the linear head, where a composition of the process gases may be varied depending on the surface treatment provided to the substrate. The design of the atmospheric plasma treatment station in the process tool reduces queue time between treating the substrate and depositing materials on the substrate.

Figure 4A:
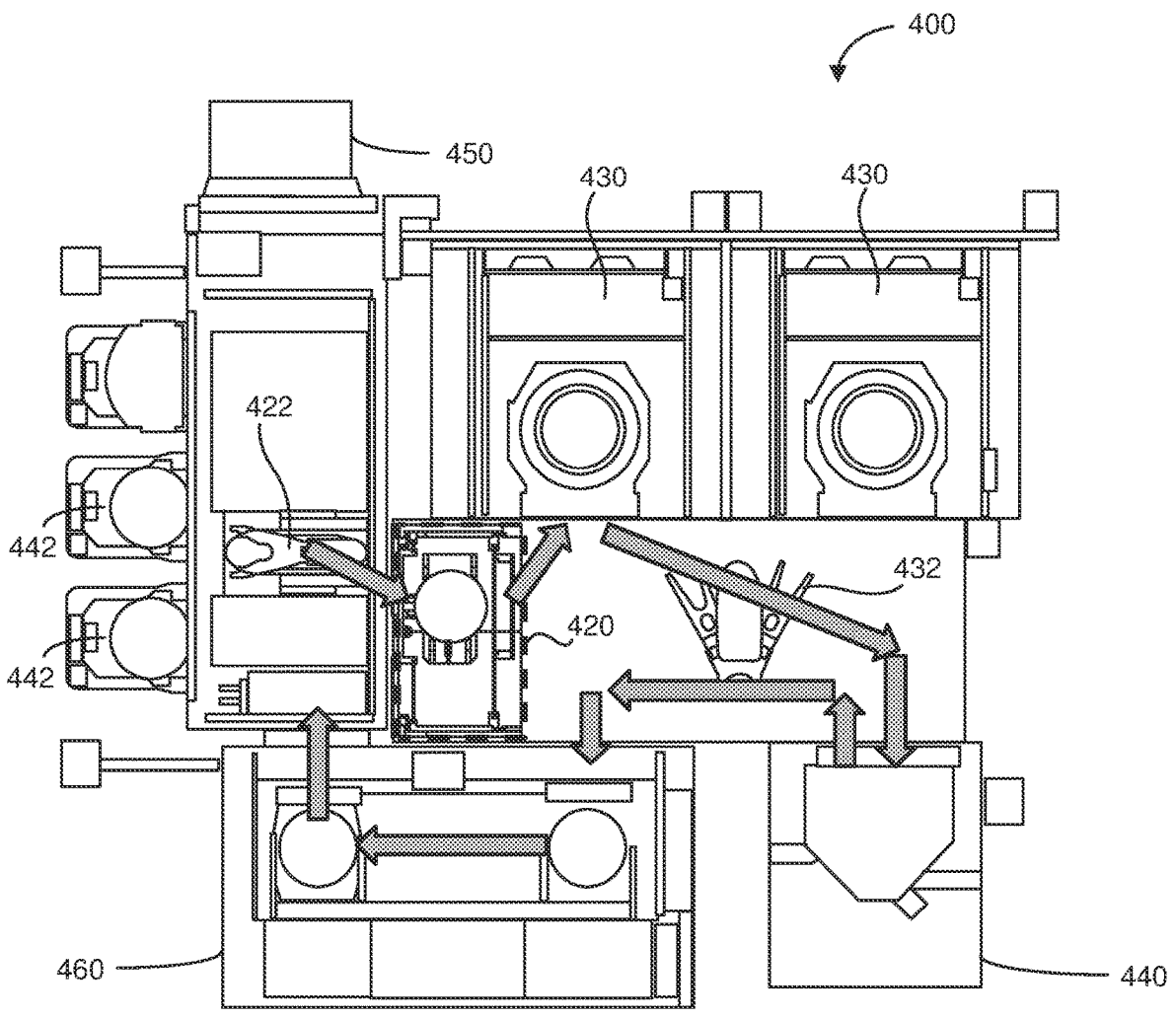
FIG. 4A shows a schematic illustration of an example semiconductor process tool for substrate processing and deposition according to some implementations.

FIG. 4A shows a schematic illustration of an example semiconductor process tool for substrate processing and deposition according to some implementations. A semiconductor process tool 400 may process one or more semiconductor substrates in a multi-chamber system or cluster tool that has the capability to sequentially process semiconductor substrates in a controlled manner. The semiconductor process tool 400 may receive semiconductor substrates from a clean room for processing and return the semiconductor substrates to the clean room after processing. The semiconductor process tool 400 may be used to deposit materials on the semiconductor substrates. For example, the semiconductor process tool 400 may be used to deposit materials on the semiconductor substrates by electroplating or electroless plating. The semiconductor process tool 400 may include multiple stations or chambers such as anneal stations, transfer stations, cleaning stations, metrology stations, brush stations, drying stations, pre-treatment stations, and deposition stations. Some may be wet processing stations and some may be dry processing stations. Semiconductor process tools typically include transfer robots to transfer semiconductor substrates between various chambers and stations. In FIG. 4A, the semiconductor process tool 400 includes a transfer station 420, one or more plating stations 430, a cleaning station 440, and a drying station 460.

The semiconductor process tool 400 includes one or more cassettes 442 for receiving semiconductor substrates. The one or more cassettes 442 may be pods or front opening unified pods (FOUPs) for receiving the semiconductor substrates that are to be processed in the semiconductor process tool 400. A conveying robot 422 is configured to move along a semiconductor substrate and transfer the semiconductor substrate from the cassette 442 to the transfer station 420. In some implementations, the conveying robot 422 may have one or more arms, where each arm may have an end effector for picking up the semiconductor substrate for transport.

Figure 4B:
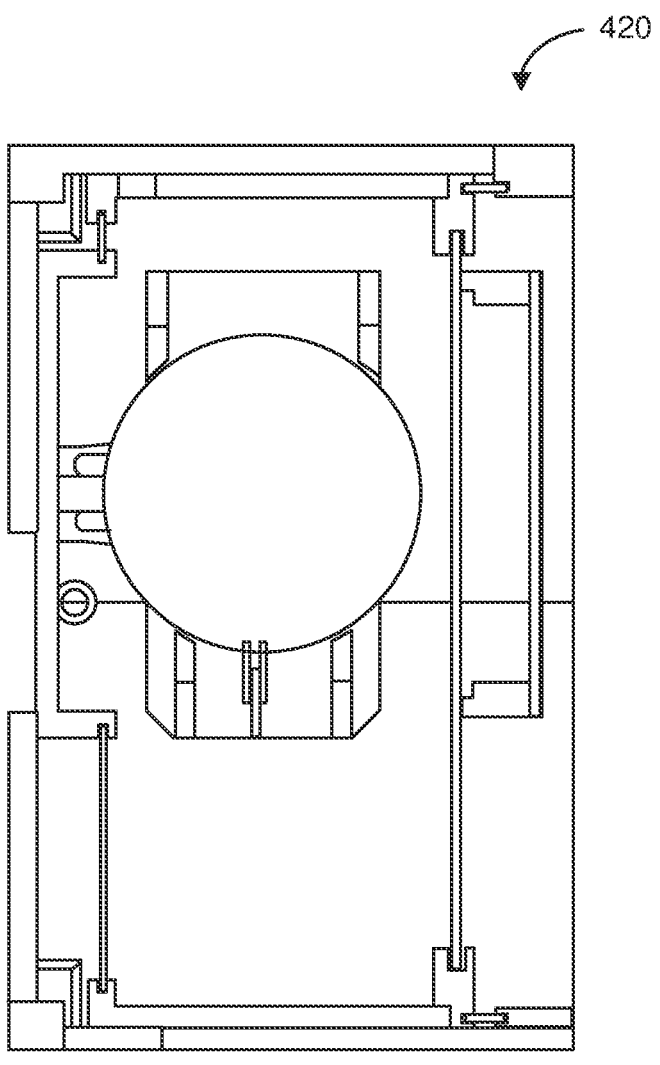
FIG. 4B shows a schematic illustration of an example transfer station in the semiconductor process tool of FIG. 4A according to some implementations.

The transfer station 420 may interface with multiple stations in the semiconductor process tool 400. As shown in FIG. 4A, the transfer station 420 may interface with the one or more plating stations 430. The transfer station 420 may include at least a platform, pedestal, or other support(s) for supporting one or more semiconductor substrates. FIG. 4B shows a schematic illustration of an example transfer station in the semiconductor process tool of FIG. 4A according to some implementations. In some implementations, the transfer station 420 may be exposed to atmospheric conditions. In some implementations, the transfer station 420 may be pumped down to sub-atmospheric pressures or vacuum pressures. In some implementations, the transfer station 420 may provide a flow of non-reactive gas such as argon (Ar) or nitrogen ($N_2$) to limit contamination.

The transfer station 420 may be configured to transfer semiconductor substrates to the one or more plating stations 430. In some implementations, the one or more plating stations 430 may be electroless plating stations 430. However, it will be understood that the one or more plating stations 430 may be any suitable deposition station for depositing materials, where the deposition station may be a PVD station, a CVD station, ALD station, or electroplating station. The one or more plating stations 430 may perform electroplating or electroless plating operations on the semiconductor substrates, where the semiconductor substrates may be in a controlled environment and exposed to plating solution for selectively depositing metal on the surfaces of the semiconductor substrates.

After deposition, the semiconductor substrates may be transferred back to the transfer station 420 or moved via a handling robot 432 to the cleaning station 440. Though FIG. 4A depicts a cleaning station 440, it will be understood that the cleaning station 440 may be any post-deposition treatment station for treating semiconductor substrates after deposition. The cleaning station 440 may be configured to remove residual artifacts or contaminants from the surfaces of the semiconductor substrates. For instance, the cleaning station 440 may include a brush-box, fluid delivery nozzle, or other cleaning mechanism for cleaning the semiconductor substrates.

After cleaning, the semiconductor substrates may be returned to the transfer station 420 or moved via the handling robot 432 to a drying station 460. In some implementations, the drying station 460 is integrated with the cleaning station 440. In some implementations, the drying station 460 may expose the semiconductor substrates to drying gases. From the drying station 460, the semiconductor substrates may be returned to cassettes 442 via the conveying robot 422. As a result, semiconductor substrates may be returned having been cleaned and dried to a clean room after plating. The arrows in FIG. 4A illustrate a wafer path through the semiconductor process tool 400.

A controller 450 is coupled to and controls the operations of each of the cassettes 442, the conveying robot 422, the transfer station 420, the one or more plating stations 430, the handling robot 432, the cleaning station 440, and the drying station 460 of the semiconductor process tool 400. The controller 450 controls some or all of the properties of the semiconductor process tool 400. The controller 450 typically includes one or more memory devices and one or more processors. Aspects of the controller 450 are described in more detail below.

In the present disclosure, a wafer transfer station of a semiconductor process tool may be modified as an atmospheric plasma treatment station. That way, the atmospheric plasma treatment station is integrated within the semiconductor process tool without adding to equipment footprint or form factor. Alternatively, the atmospheric plasma treatment station may replace or modify existing treatment stations that can interface with a deposition station. Such existing treatment stations may include anneal stations, vacuum plasma treatment stations, wet clean stations, dry clean stations, and the like. An existing treatment station such as a wet clean station may not be strong enough to remove oxides and organic impurities from incoming semiconductor substrates. Furthermore, an existing treatment station such as a vacuum plasma treatment station may effectively remove oxides and organic impurities, but the vacuum plasma treatment station may be expensive, increase equipment footprint, increase queue time, and reduce throughput. An atmospheric plasma treatment station may be up to four times lower in cost compared to a vacuum plasma treatment station. The atmospheric plasma treatment station may effectively remove oxides, organic impurities, and other contaminants without the disadvantages of a vacuum plasma treatment station. In some cases, this can facilitate uniform electroless deposition and lower defects after electroless deposition.

Figure 5A:
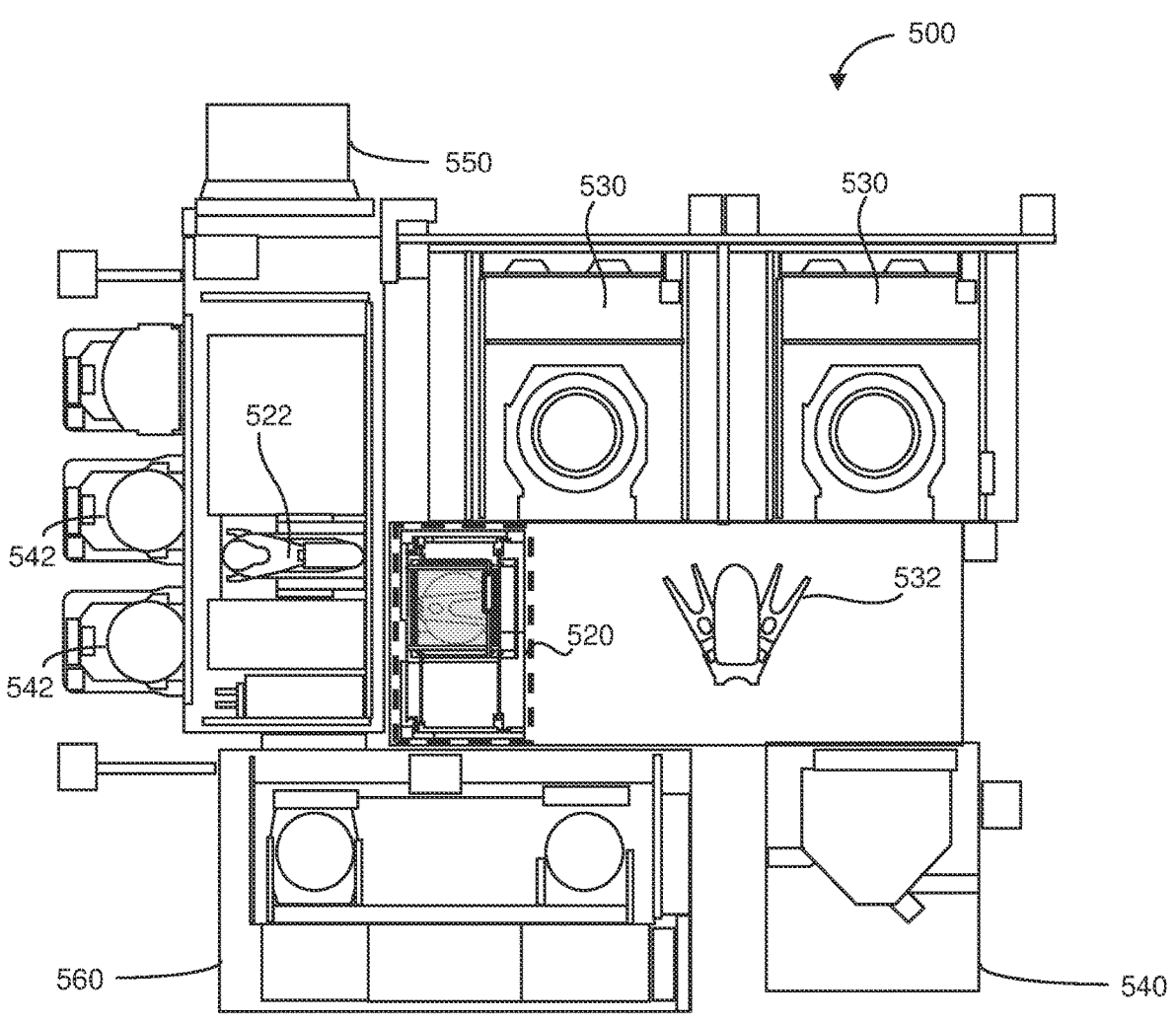
FIG. 5A shows a schematic illustration of an example semiconductor process tool for substrate plasma pretreatment and deposition according to some implementations.

FIG. 5A shows a schematic illustration of an example semiconductor process tool for substrate plasma pretreatment and deposition according to some implementations. A semiconductor process tool 500 in FIG. 5A may process one or more semiconductor substrates in a multi-chamber system or cluster tool similar to the semiconductor process tool 400 in FIG. 4A. The semiconductor process tool 500 may be used to deposit materials on the one or more semiconductor substrates by certain deposition techniques such as electroplating or electroless plating. The semiconductor process tool 500 may integrate an atmospheric plasma treatment station 520 to interface with one or more plating stations 530. In FIG. 5A, the semiconductor process tool 500 includes the atmospheric plasma treatment station 520, one or more plating stations 530, a cleaning station 540, and a drying station 560.

The semiconductor process tool 500 includes one or more cassettes 542 for receiving semiconductor substrates. The one or more cassettes 542 may be pods or FOUPs for receiving the semiconductor substrates that are to be processed in the semiconductor process tool 500. A conveying robot 522 is configured to move along a semiconductor substrate and transfer the semiconductor substrate from the cassette 542 to the atmospheric plasma treatment station 520. In some implementations, the conveying robot 522 may have one or more arms, where each arm may have an end effector for picking up the semiconductor substrate for transport.

The atmospheric plasma treatment station 520 may interface with one or more stations in the semiconductor process tool 500. As shown in FIG. 5A, the atmospheric plasma treatment station 520 may interface with the one or more plating stations 530.

Figure 5B:
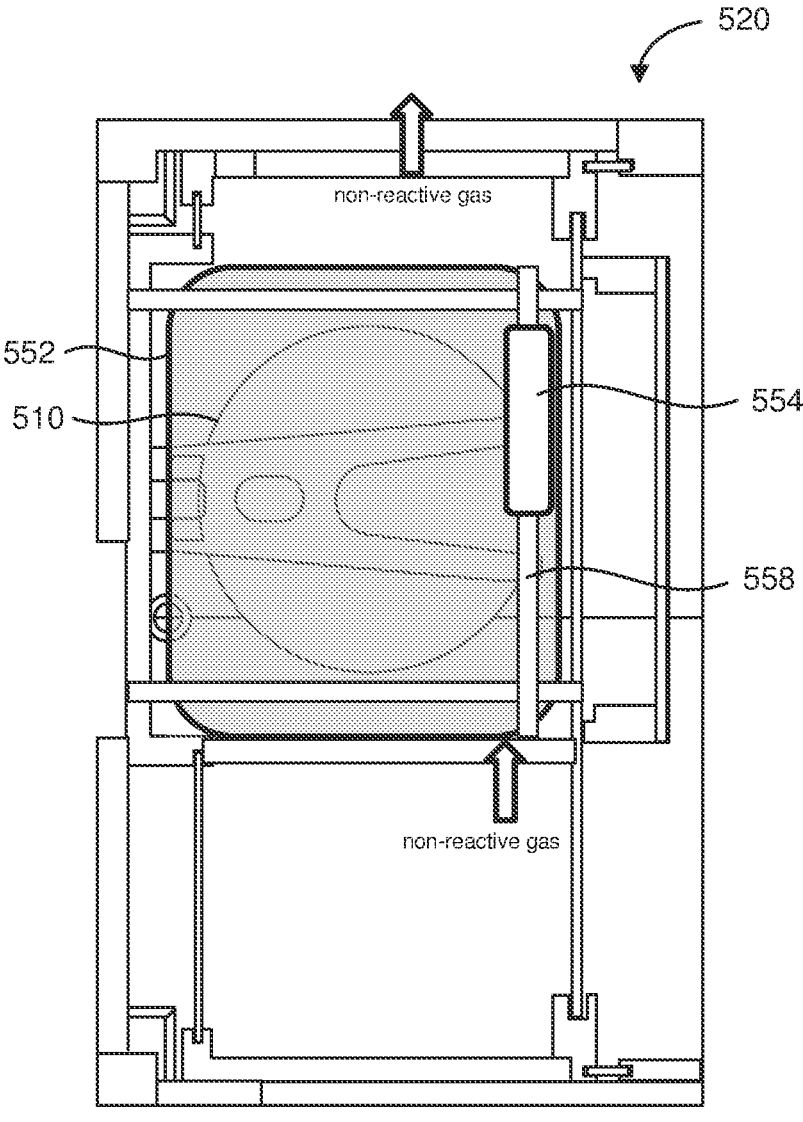
FIG. 5B shows a schematic illustration of an example atmospheric plasma treatment station integrated in the semiconductor process tool of FIG. 5A according to some implementations.
Figure 5C:
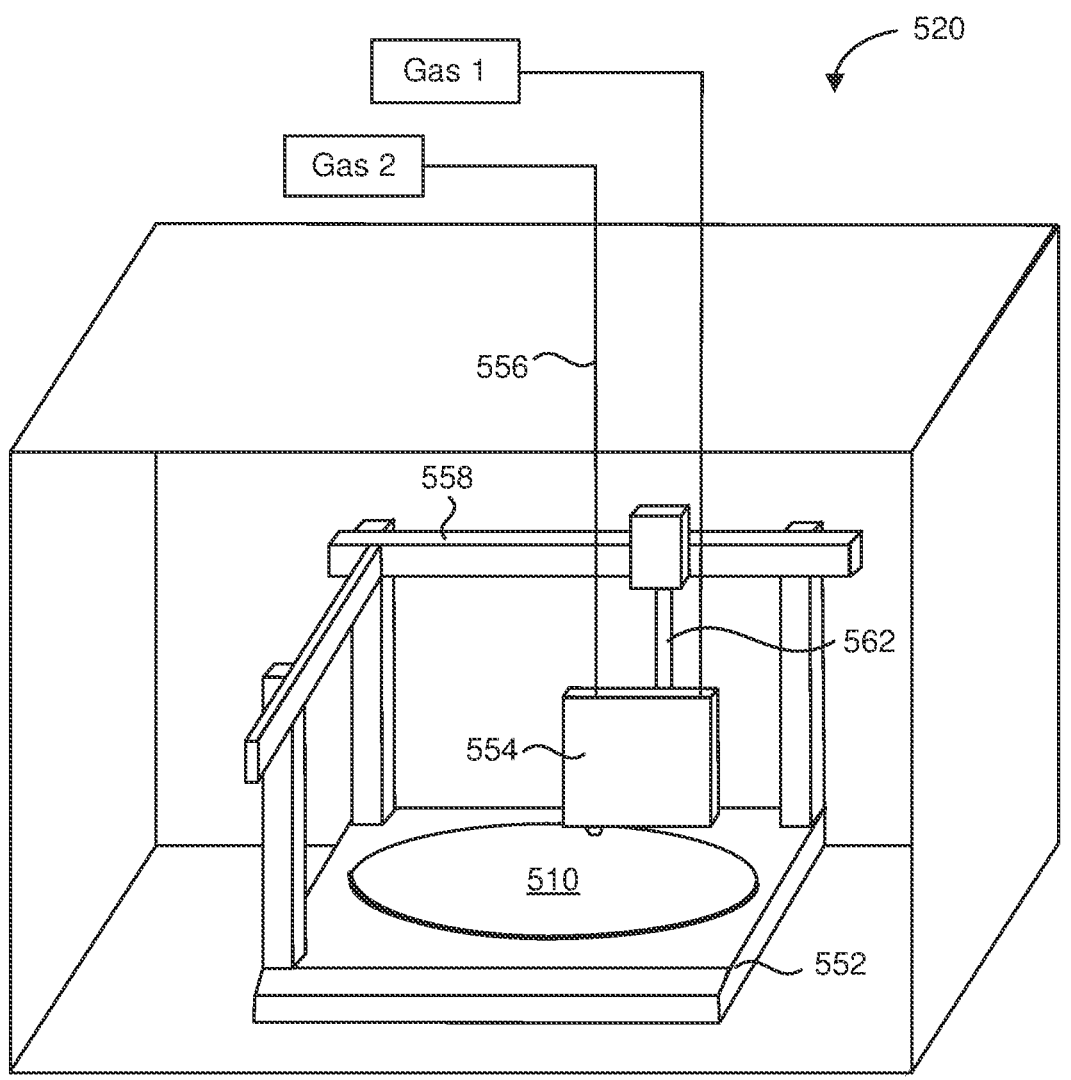
FIG. 5C shows a perspective view of an example atmospheric plasma treatment station integrated in the semiconductor process tool of FIG. 5A according to some implementations.

FIG. 5B shows a schematic illustration of an example atmospheric plasma treatment station integrated in the semiconductor process tool of FIG. 5A according to some implementations. FIG. 5C shows a perspective view of the atmospheric plasma treatment station integrated in the semiconductor process tool of FIG. 5A according to some implementations. The atmospheric plasma treatment station 520 may include a substrate support 552 for supporting a semiconductor substrate 510. In some implementations, the substrate support 552 is movable. Specifically, the movable substrate support 552 may be rotatable and/or translatable. This allows different regions of the semiconductor substrate 510 to be exposed to the atmospheric plasma when moving the semiconductor substrate 510 through the atmospheric plasma treatment station 520.

In some implementations, the substrate support 552 may be coupled with one or more heating elements and/or cooling elements for temperature control. One or more heating elements may be coupled to a heating assembly in the substrate support 552 facing the semiconductor substrate 510 for substrate temperature control. For instance, the substrate support 552 may be a hot plate. Substrate temperature may be tuned to improve or speed up scanning of the semiconductor substrate 510 in the atmospheric plasma treatment station 520, particularly for optimizing oxide reduction on the surface of the semiconductor substrate 510. Elevated substrate temperatures may increase reactivity at the surface of the semiconductor substrate 510 to enable faster scan speeds. In some implementations, the semiconductor substrate 510 may be heated to a temperature greater than about 30° C., greater than about 50° C., or greater than about 75° C. during exposure to atmospheric plasma in the atmospheric plasma treatment station 520. In some implementations, the semiconductor substrate 510 may be cooled to a temperature less than about 75° C., less than about 50° C., or less than about 30° C. after exposure to atmospheric plasma. That way, the semiconductor substrate 510 may be cooled to a reduced temperature or room temperature prior to plating.

The atmospheric plasma treatment station 520 may be an enclosed space having a controlled environment. Typically, substrates being treated in a plasma environment require additional assembly for load lock operation and vacuum pumping. Pumping a plasma treatment station to reduced pressures (e.g., between about 0.1 Torr and about 5 Torr) adds to queue time. Plasma treatment stations usually occupy an increased amount of space (e.g., floor space) and reduce the throughput of substrate processing. The atmospheric plasma treatment station 520 avoids costly vacuum equipment, load locks, and robotic assemblies while reducing queue time and increasing throughput.

The atmospheric plasma treatment station 520 does not expose the semiconductor substrate 510 to ambient conditions that may potentially cause oxidation or other forms of contamination. Instead, positive pressure may be maintained in the atmospheric plasma treatment station 520 by flowing gas into an interior of the atmospheric plasma treatment station 520. The gas may be a non-reactive or inert gas such as nitrogen, helium, argon, neon, krypton, xenon, or radon. For example, the inert gas(es) flowed into the atmospheric plasma treatment station 520 may include argon, nitrogen, or combinations thereof. In some implementations, the interior of the atmospheric plasma treatment station 520 is maintained at a positive pressure relative to the pressure outside of the atmospheric plasma treatment station 520 (i.e., ambient pressure). Atmospheric impurities such as oxygen may be prevented from entering the interior of the atmospheric plasma treatment station 520. Thus, the enclosed controlled environment of the atmospheric plasma treatment station 520 is free or substantially free of oxygen. The positive pressure may be maintained by the flow of inert gas(es) during exposure to atmospheric plasma. In some implementations, the inert gas(es) may flow over the top of the semiconductor substrate 510 in a laminar flow. The inert gas(es) may flow from one side of the atmospheric plasma treatment station 520 to an opposite side, where the inert gas(es) may be exhausted or vented out of the atmospheric plasma treatment station 520. The flow of inert gas(es) provides a controlled environment in the interior of the atmospheric plasma treatment station 520, where the atmospheric plasma treatment station 520 is below, equal, or above ambient pressure. One or more mass flow controllers (MFCs) may provide the flow of the inert gas(es) at a controlled rate into the interior of the atmospheric plasma treatment station 520.

The atmospheric plasma treatment station 520 further includes a linear head 554 positioned over the temperature-controllable substrate support 552. The linear head 554 may also be referred to as a plasma head. In some implementations, the linear head 554 may be relatively small and have a diameter/width that is between about 100 mm and about 300 mm. The linear head 554 includes one or more inlets for receiving process gases and one or more outlets for discharging atmospheric plasma from the linear head 554 to the semiconductor substrate 510. Atmospheric plasma may be generated in the linear head 554 and discharged from the linear head 554 by igniting the process gases by DC or AC excitation. An RF power supply (not shown) may be used to generate the atmospheric plasma in the linear head 554. In some implementations, the atmospheric plasma exiting the linear head 554 is a linear beam.

The process gas may include one or more reactive gas species. The reactive gas species may act as a reducing agent for reducing oxides. Alternatively, the reactive gas species may act as a chemical reagent for decomposing organic impurities. In some implementations, the process gas includes a mixture of a reactive gas species and an inert (diluting) gas species. Examples of reactive gas species include but are not limited to oxygen, hydrogen, water, nitrogen, ammonia, hydrazine, carbon monoxide, carbon dioxide, diborane, methane, carbon tetrafluoride, octafluorobutane, nitrogen trifluoride, sulfur hexafluoride, and other reactive species that would be obvious to those skilled in the art. Examples of inert gas species include but are not limited to nitrogen, helium, argon, neon, krypton, xenon, and radon. In some implementations, the inert gas species may be the major plasma gas and the reactive species may be a dopant gas. Accordingly, the atmospheric plasma may be composed primarily of inert gas radicals. In some implementations, the process gas may include a mixture of hydrogen and argon or a mixture of argon and nitrogen/hydrogen gas (forming gas). In some implementations, the process gas may include a mixture of argon and oxygen.

The process gases may be flowed to the linear head 554 by one or more gas lines 556. The one or more gas lines 556 may supply process gases into the linear head 554 by one or more inlets. MFCs may control the flow of the process gases into the linear head 554. The composition and flow rates of the process gases may be adjusted depending on a surface condition of the semiconductor substrate 510 to be treated. By way of an example, a first composition may be delivered via the one or more gas lines 556 to the linear head 554 for treating a first surface condition (e.g., removing organic impurities), and a second composition may be delivered via the one or more gas lines 556 to the linear head 554 for treating a second surface condition (e.g., reducing oxides).

The atmospheric plasma treatment station 520 may further include a track 558 positioned above the substrate support 552. The track 558 may be stationary and the linear head 554 may be movable along the track 558. The track 558 may extend in one or more directions defined by a major surface of the semiconductor substrate 510, where the directions may include the x-direction and y-direction. Accordingly, the linear head 554 may be movable along the track 558 in the x-direction and/or the y-direction. Movement along the track 558 may enable the linear head 554 to scan or target certain regions of the semiconductor substrate 510. In particular, the linear head 554 may target the surface of the semiconductor substrate 510 with atmospheric plasma at specific locations (x-y coordinates) by positioning the linear head 554 along the track 558. In some implementations, the linear head 554 may be coupled to the track 558 via a robot arm 562. The robot arm 562 may secure the linear head 554 to the track 558. In some implementations, the linear head 554 may be movable along the robot arm 562 along a z-direction (vertical direction) to position the linear head 554 closer or further from the surface of the semiconductor substrate 510. The distance between the linear head 554 and the surface of the semiconductor substrate 510 impacts the surface treatment. The linear head 554 is capable of scanning the semiconductor substrate 510 in the x- and y-directions at a distance z over the semiconductor substrate 510.

In some implementations, the linear head 554 is configured to scan the surface of the semiconductor substrate 510 by moving the semiconductor substrate 510 along the movable substrate support 552, or by moving the linear head 554 along the track 558. In some implementations, both the semiconductor substrate 510 and the linear head 554 can move so that the semiconductor substrate 510 can be scanned. This provides increased flexibility for appropriately positioning the linear head 554 over certain regions of the semiconductor substrate 510.

The atmospheric plasma treatment station 520 may be configured to transfer the semiconductor substrate 510 to the one or more plating stations 530. In some implementations, the one or more plating stations 530 may be electroless plating stations 530. However, it will be understood that the one or more plating stations 530 may be any suitable deposition station for depositing materials, where the deposition station may include but is not limited to a PVD station, a CVD station, or ALD station. The one or more plating stations 530 may perform electroplating or electroless plating operations on the semiconductor substrate 510, where the semiconductor substrate 510 may be in a controlled environment and exposed to plating solution for selectively depositing metal on the surface of the semiconductor substrate 510.

After deposition, the semiconductor substrate 510 may be transferred or moved via a handling robot 532 to the cleaning station 540. Though FIG. 5A depicts a cleaning station 540, it will be understood that the cleaning station 540 may be any post-deposition treatment station for treating the semiconductor substrate 510 after deposition. The cleaning station 540 may be configured to remove residual artifacts or contaminants from the surface of the semiconductor substrate 510. For instance, the cleaning station 540 may include a brush-box, fluid delivery nozzle, or other cleaning mechanism for cleaning the semiconductor substrate 510.

After cleaning, the semiconductor substrate 510 may be transferred or moved via the handling robot 532 to a drying station 560. In some implementations, the drying station 560 is integrated with the cleaning station 540. In some implementations, the drying station 560 may expose the semiconductor substrate 510 to drying gases. From the drying station 560, the semiconductor substrate 510 may be returned to cassettes 542 via the conveying robot 522. As a result, the semiconductor substrate 510 may be returned to a clean room after plating having been cleaned and dried.

A controller 550 is coupled to and controls the operations of each of the cassettes 542, the conveying robot 522, the atmospheric plasma treatment station 520, the one or more plating stations 530, the cleaning station 540, and the drying station 560 of the semiconductor process tool 500. The controller 550 controls some or all of the properties of the semiconductor process tool 500. The controller 550 typically includes one or more memory devices and one or more processors. Aspects of the controller 550 are described in more detail below.

Figure 6:
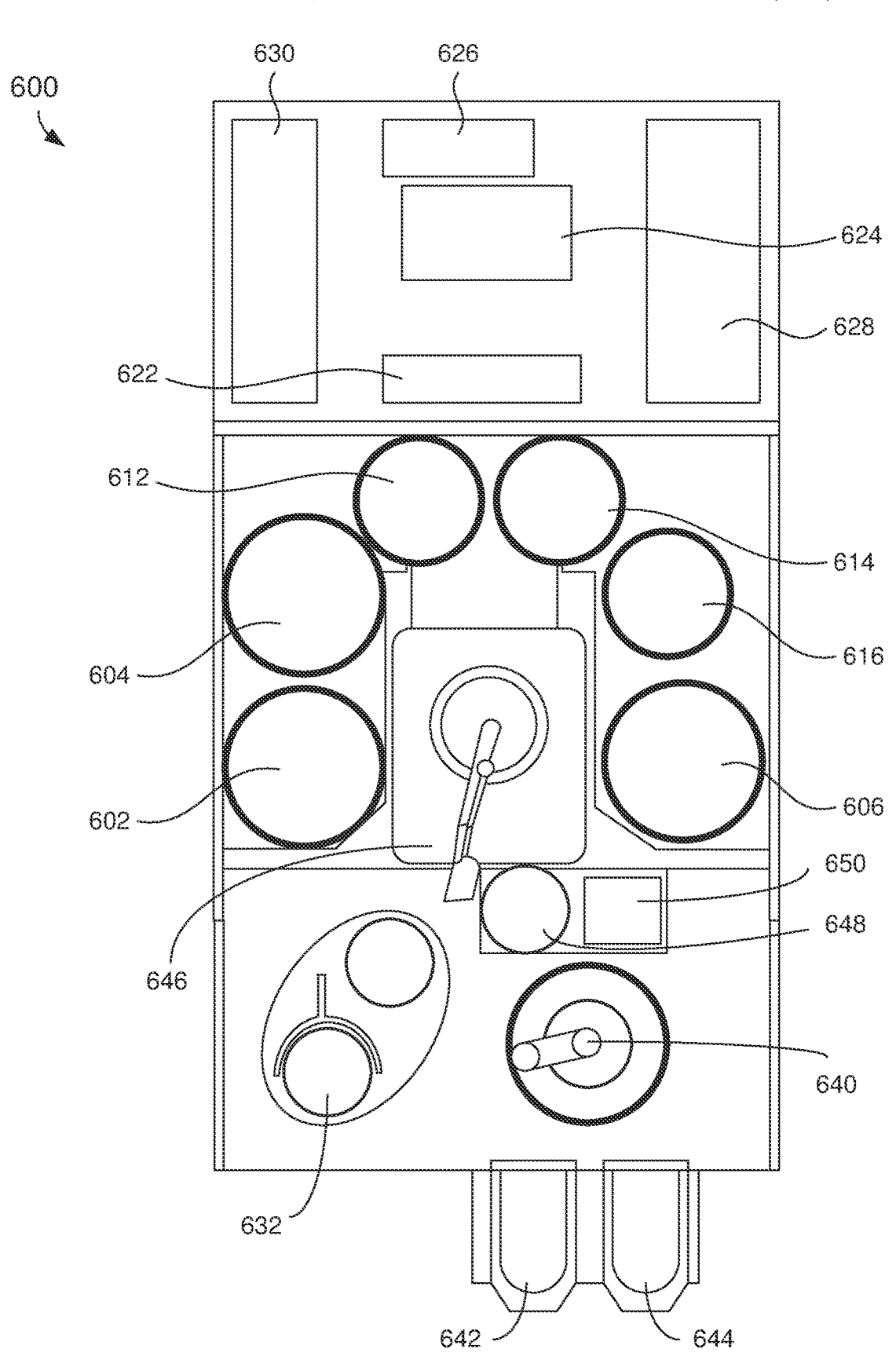
FIG. 6 shows a top view schematic illustration of an electroplating apparatus according to some implementations.

FIG. 6 shows a top view schematic illustration of an electroplating apparatus according to some implementations. One example of a plating apparatus that may be used according to implementations herein is the Sabre® tool manufactured by Lam Research Corporation of Fremont, CA. An electrodeposition apparatus 600 can include three separate electroplating modules 602, 604, and 606. The electrodeposition apparatus 600 can also include three separate modules 612, 614, and 616 configured for various process operations. For example, in some implementations, one of the modules 612, 614, and 616 may be a spin rinse drying (SRD) module. In other implementations, one or more of the modules 612, 614, and 616 may be post-electrofill modules (PEMs), each configured to perform a function, such as edge bevel removal, backside etching, and acid cleaning of substrates after they have been processed by one of the electroplating modules 602, 604, and 606. The electrodeposition apparatus 600 may include a central electrodeposition chamber 624. The central electrodeposition chamber 624 is a chamber that holds the chemical solution used as the electroplating solution in the electroplating modules 602, 604, and 606. The electrodeposition apparatus 600 also includes a dosing system 626 that may store and deliver additives for the electroplating solution. A chemical dilution module 622 may store and mix chemicals to be used as an etchant. A filtration and pumping unit 628 may filter the electroplating solution for the central electrodeposition chamber 624 and pump it to the electroplating modules.

A hand-off tool 640 may select a substrate from a substrate cassette 642 or the cassette 644. The cassettes 642, 644 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 640 may hold the substrate using a vacuum attachment or some other attachment mechanism.

The hand-off tool 640 may interface with a wafer handling station 632, the cassettes 642, 644, an atmospheric plasma treatment station 650, or an aligner 648. From the atmospheric plasma treatment station 650, a hand-off tool 646 may gain access to the substrate. The atmospheric plasma treatment station 650 may be integrated in the electrodeposition apparatus 600 to interface with the hand-off tool 640 and the hand-off tool 646. The atmospheric plasma treatment station 650 may include a linear head, a track, one or more process gas lines for delivering process gases to the linear head, and one or more inert gas lines for delivering inert gas species to an enclosed space in the atmospheric plasma treatment station 650. The atmospheric plasma treatment station 650 may further include one or more heater elements or a hot plate for substrate temperature control. The atmospheric plasma treatment station 650 may be a slot or a position from and to which hand-off tools 640 and 646 may pass substrates without going through the aligner 648. In some implementations, however, to ensure that the substrate is properly aligned on the hand-off tool 646 for precision delivery to an electroplating module, the hand-off tool 646 may align the substrate with an aligner 648. The hand-off tool 646 may also deliver a substrate with an aligner 648. The hand-off tool 646 may also deliver a substrate to one of the electroplating modules 602, 604, or 606 or to one of the three separate modules 612, 614, and 616 configured for various process operations.

An example of a process operation according to the methods described here may proceed as follows: (1) receive a substrate in cassette 642 or 644; (2) provide the substrate in the atmospheric plasma treatment station 650; (3) expose the substrate to atmospheric plasma in the atmospheric plasma treatment station 650; (4) electrodeposit metal onto the substrate in one of the electroplating modules 602, 604, or 606; (5) optionally rinse and dry the substrate in SRD in one of the modules 612, 614, or 616; (6) optionally perform edge bevel removal in one of the modules 612, 614, or 616.

A controller 630 (e.g., system controller) provides electronic and interface controls required to operate the electrodeposition apparatus 600. Aspects of the controller 630 described herein may also apply to the controller 550 in FIG. 5A and the controller 450 in FIG. 4A. The controller 630 (which may include one or more physical or logical controllers) controls some or all of the properties of the electrodeposition apparatus 600. The controller 630 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the controller 630 or they may be provided over a network. In certain implementations, the controller 630 executes system control software.

The system control software in the electrodeposition apparatus 600 may include instructions for controlling the timing, mixture of electrolyte components (including the concentration of one or more electrolyte components), inlet pressure, plating cell pressure, plating cell temperature, substrate temperature, current and potential applied to the substrate and any other electrodes, substrate position, substrate rotation, and other parameters of a particular process performed by the electrodeposition apparatus 600. Additionally, the system control software in the electrodeposition apparatus 600 may include instructions for controlling the process gas composition, inert gas composition, process gas flow rates, inert gas flow rates, RF power, RF frequency, linear head position, scan speed, substrate position, substrate rotation, substrate temperature, treatment duration, pressure, and other parameters of a particular process performed by the atmospheric plasma treatment station 650. System control logic may be configured in any suitable way. For example, various process tool component sub-routines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some implementations, system control logic includes input/output control (IOC) sequencing instructions for controlling the various parameters described above. For example, each phase of an electroplating process may include one or more instructions for execution by the controller 630. The instructions for setting process conditions for an immersion process phase may be included in a corresponding immersion recipe phase. In some implementations, the electroplating recipe phases may be sequentially arranged, so that all instructions for an electroplating process phase are executed concurrently with that process phase.

The control logic may be divided into various components such as programs or sections of programs in some implementations. Examples of logic components for this purpose include a substrate positioning component, an electrolyte composition control component, a pressure control component, a heater control component, and a potential/current power supply control component.

In some implementations, there may be a user interface associated with the controller 630. The user interface may include a display screen, graphical software displays of the apparatus and/or process conditions, and user input devices such as pointing devices, keyboards, touch screens, microphones, etc.

In some implementations, parameters adjusted by the controller 630 may relate to process conditions. Non-limiting examples include bath conditions (temperature, composition, and flow rate), substrate position (rotation rate, linear speed) at various stages, linear head position (linear speed), process gas composition and associated flow rates, inert gas composition and associated flow rates, substrate temperature, pressure, etc. These parameters may be provided to the user in the form of a recipe, which may be entered utilizing the user interface.

Signals for monitoring the process may be provided by analog and/or digital input connections of the controller 630 from various process tool sensors. The signals for controlling the process may be output on the analog and digital output connections of the process tool. Non-limiting examples of process tool sensors that may be monitored include mass flow controllers, pressure sensors (such as manometers), thermocouples, optical sensors, etc. Appropriately programmed feedback and control algorithms may be used with data from these sensors to maintain process conditions or adjust process conditions.

In some implementations, the controller 630 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), scan speed settings, pressure settings, power settings, radio frequency (RF) generator settings, RF matching circuit settings, frequency settings, flow rate settings, fluid delivery settings, positional and operation settings, wafer transfers into and out of a tool and other transfer tools connected to or interfaced with a specific system.

Broadly speaking, the controller 630 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 630 in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller 630, in some implementations, may be a part of or coupled to a computer that is integrated with, coupled to the system, otherwise networked to the system, or a combination thereof. For example, the controller 630 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 630 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems in the present disclosure may include a deposition chamber or module, a metal plating chamber or module, a clean chamber or module, a PVD chamber or module, a CVD chamber or module, an ALD chamber or module, a track chamber or module, and any other semiconductor processing systems that may be associated or used in the fabrication and/or manufacturing of semiconductor wafers.

Figure 7:
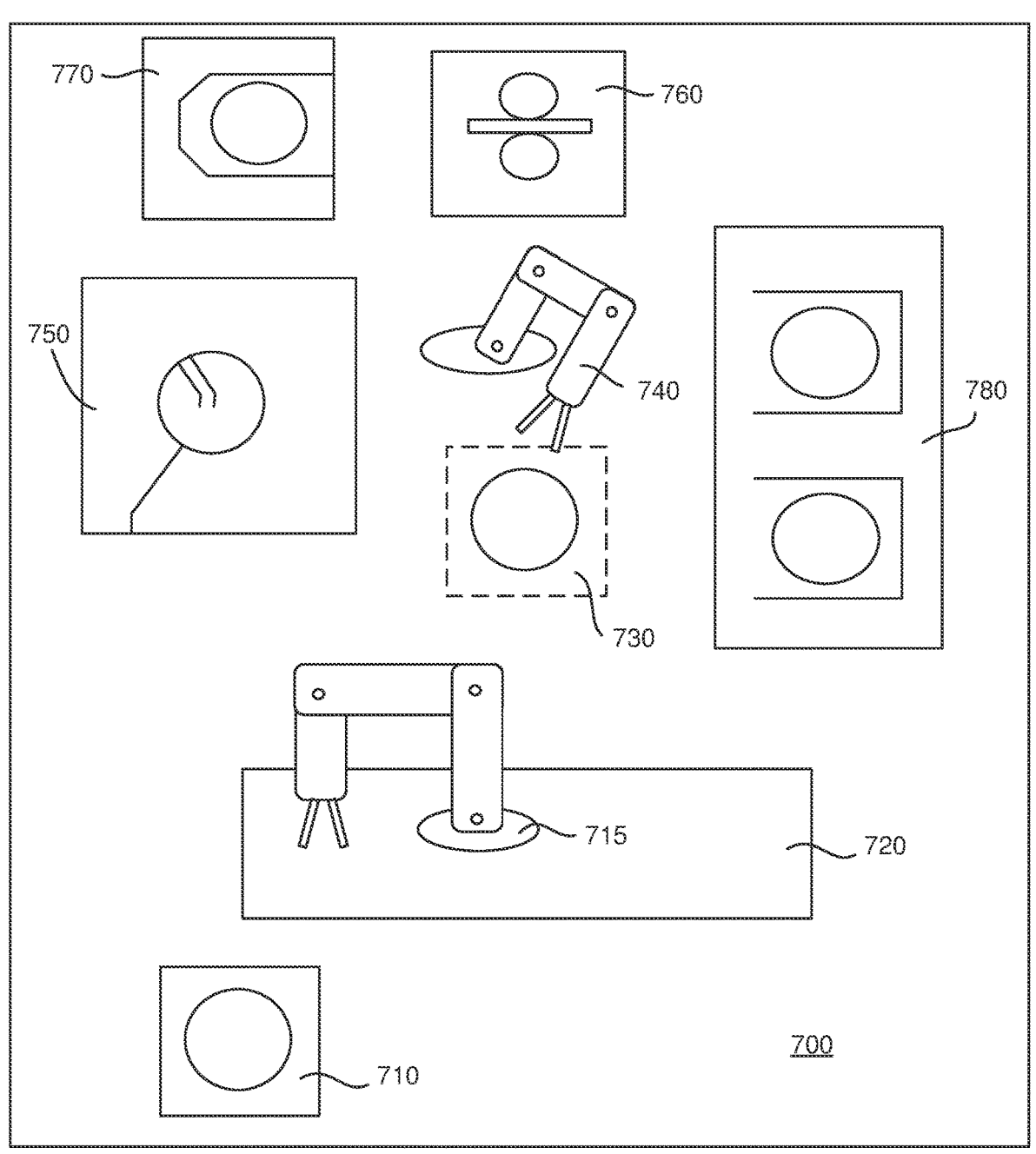
FIG. 7 shows a top view schematic illustration of an electroless plating apparatus according to some implementations.

FIG. 7 shows a top view schematic illustration of an electroless plating apparatus according to some implementations. In an electroless deposition (ELD) apparatus 700, a substrate is received into the ELD apparatus 700 through a loading port 710. The loading port 710 may include a plurality of substrate receiving units, which can be front-opening unified pods (FOUPs). The loading port 710 receives and delivers the substrate to a transfer shelf 730 within the ELD apparatus 700. The substrate is moved from the transfer shelf 730 to an ELD module 750 within the ELD apparatus 700. While the loading port 710 is one form of receiving the substrate in the ELD apparatus 700, other mechanisms can be used in delivering the substrate into the ELD module 750. For example, an atmospheric transfer machine (ATM) module 720 can be maintained in a controlled environment within the ELD apparatus 700. A substrate delivery system, such as a dry robot 715, can be engaged for transferring the substrate. The dry robot 715 may be provided in the ATM module 720 and may be used to retrieve the substrate from the loading port 710 and deposit the substrate on to the transfer shelf 730. The transfer shelf 730 is an optional component in the ELD apparatus 700.

In some implementations of the present disclosure, the transfer shelf 730 may be configured as an atmospheric plasma treatment station 730. The atmospheric plasma treatment station 730 may include a linear head, a track, one or more process gas lines for delivering process gases to the linear head, and one or more inert gas lines for delivering inert gas species to an enclosed space in the atmospheric plasma treatment station 730. The atmospheric plasma treatment station 730 may further include one or more heater elements or a hot plate for substrate temperature control. The atmospheric plasma treatment station 730 may expose the substrate to atmospheric plasma prior to delivering the substrate to an ELD module 750.

The ELD module 750 is used in electroless plating of the substrate. In some implementations, a wet robot 740 retrieves the substrate from the atmospheric plasma treatment station 730 and transports the substrate to the ELD module 750. The ELD module 750 may be configured to (a) optionally pre-rinse the substrate, (b) perform an electroless deposition process to deposit a layer of metal on the surface of the substrate, and (c) optionally rinse the substrate with a post-deposition rinsing fluid. The wet robot 740 assists in the transfer of the substrate from the ELD module 750 to a post-deposition module.

The ELD apparatus 700 includes a plurality of post-deposition modules such as a chemical module 770, a brush scrub module 760, and a clean module 780. The substrate may be received in the chemical module 770, where the chemical module 770 may be configured to apply an acid-containing fluid to remove traces of the deposition fluid from areas of the substrate not intended to receive the deposition fluid. In addition or in the alternative to an acid-containing solution, the chemical module 770 may be configured to apply a basic-containing fluid. A rinsing fluid may be subsequently applied in the chemical module 770 to rinse off the acid-containing fluid and/or basic-containing fluid. The substrate may be moved from the chemical module 770 to the brush scrub module 760. The brush scrub module 760 may be configured with one or more brush units for mechanically cleaning the substrate. The substrate may be transferred from the brush scrub module 760 and inserted into another post-deposition module such as a clean module 780. The clean module 780 may be configured to rinse and dry the substrate. The substrate may be moved from the clean module 780 and transferred back to the loading port 710 via the ATM module 720.

Figure 8:
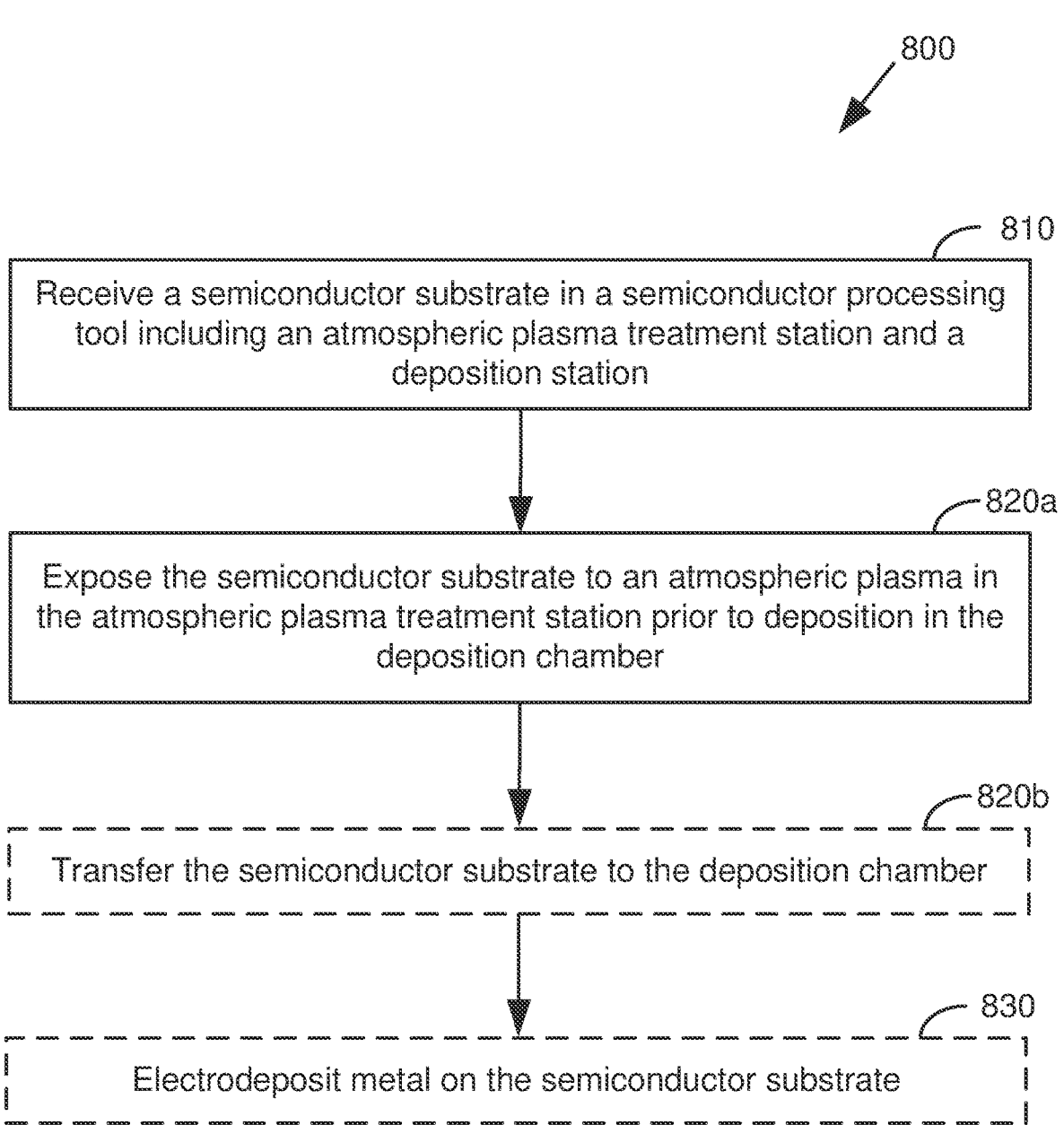
FIG. 8 shows a flow diagram illustrating an example method of treating a semiconductor substrate with an atmospheric plasma prior to deposition according to some implementations.

FIG. 8 shows a flow diagram illustrating an example method of treating a semiconductor substrate with an atmospheric plasma prior to deposition according to some implementations. The operations of a process 800 may be performed in different orders and/or with different, fewer, or additional operations. Aspects of the process 800 may be described with reference to FIGS. 9A-9D. The operations of the process 800 may be performed using a semiconductor process tool as shown in FIGS. 5A-5C, and it's possible that an atmospheric plasma treatment station may be implemented in any of the tool architectures shown in FIGS. 4A, 5A, 6, and 7. In some implementations, the operations of the process 800 may be implemented, at least in part, according to software stored in one or more non-transitory computer readable media.

At block 810 of the process 800, a semiconductor substrate is received in a semiconductor process tool including an atmospheric plasma treatment station and a deposition station. The semiconductor substrate may have a diameter of 200 mm, or 300 mm, or 450 mm. The semiconductor substrate may be received in a cassette, pod, FOUP, or other component of the semiconductor process tool for receiving incoming substrates. In some implementations, the semiconductor substrate may undergo one or more device fabrication processes prior to being received by the semiconductor process tool. Incoming semiconductor substrates may have been etched, patterned, polished, cleaned, annealed, deposited with materials, or otherwise processed that can result in impurities or oxides being formed on surfaces of the semiconductor substrates. For example, incoming patterned CMP semiconductor substrates may have oxides and/or organic impurities that present difficulties for deposition of materials to take place. It will be understood that such defects of oxides and/or impurities may arise by processes performed outside the semiconductor process tool or within the semiconductor process tool. In addition or in the alternative to impurities and/or oxides, incoming semiconductor substrates may have surface conditions that require treatment prior to deposition. Surface conditions to be treated can include but are not limited to roughness, wettability (hydrophobicity), and electrical bias.

In some implementations, the semiconductor process tool may be a plating tool such as an electroless plating tool. An example electroless plating tool is described in FIG. 7. Prior to treatment, a material layer may be formed on a surface of the semiconductor substrate. The material layer may include, for example, a metal layer such as a PVD-deposited metal seed layer or semi-noble metal layer. The material layer can include a polished metal or dielectric layer, such as a post-CMP copper or tungsten layer. The material layer can include a low-k dielectric layer. In some instances, the material layer can include metal oxides and/or carbon compounds. In some implementations, the semiconductor substrate may include features such as recesses, vias, or trenches. The features may include recesses, vias, or trenches having a depth to width aspect ratio of greater than about 3:1, greater than about 5:1, or greater than about 10:1.

The atmospheric plasma treatment station may be integrated within the semiconductor process tool. This means existing stations or chambers may be modified to incorporate an atmospheric plasma treatment unit without adding to the semiconductor process tool's footprint. The atmospheric plasma treatment station may interface with the deposition station. As a result, the semiconductor substrate may transfer directly to the deposition station without exposure to ambient environment and without requiring additional robot assemblies, load locks, or intermediate transfer stations.

In some implementations, the incoming semiconductor substrate may be transferred to the atmospheric plasma treatment station. For example, the incoming semiconductor substrate may be received at a cassette and transferred using a conveying robot to the atmospheric plasma treatment station.

Figure 9A:
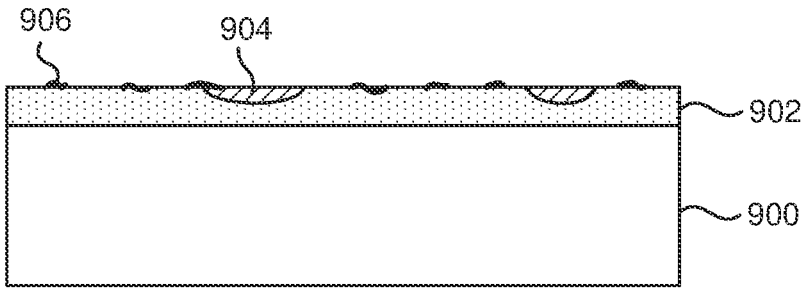
FIGS. 9A-9D show cross-sectional schematic illustrations of various processing stages for treating a semiconductor substrate substrate using an atmospheric plasma prior to deposition according to some implementations.

FIG. 9A shows a cross-sectional schematic illustration of a semiconductor substrate 900 including a seed layer 902. In some implementations, the seed layer 902 is a metal seed layer such as a copper seed layer or cobalt seed layer. A thickness of the seed layer 902 may be less than about 100 Å or less than about 50 Å. It is possible that oxidation of the seed layer 902 may occur by exposure to air or other oxygen-containing environment. Oxides 904 such as metal oxides may form on a surface of the semiconductor substrate 900. Moreover, it is possible that impurities 906 may form on the surface of the semiconductor substrate 900. Impurities 906 may come from particles in a dirty chamber, etch byproducts, deposition byproducts, residues, or other contaminants. Such impurities 906 may include organic impurities.

Returning to FIG. 8, at block 820a of the process 800, the semiconductor substrate is exposed to atmospheric plasma in the atmospheric plasma treatment station prior to deposition in the deposition chamber. Process gas(es) may be flowed into an atmospheric plasma source such as a linear head. The process gas(es) may be flowed through one or more gas lines from one or more gas sources. In some implementations, process gases may include oxygen, hydrogen, water, nitrogen, ammonia, hydrazine, carbon monoxide, carbon dioxide, diborane, methane, carbon tetrafluoride, octafluorobutane, nitrogen trifluoride, sulfur hexafluoride, helium, argon, neon, krypton, xenon, radon, or combinations thereof. The process gas(es) may be a mixture of a reactive gas (dopant gas) and an inert gas (major gas). For example, the process gas(es) may include a mixture of hydrogen and argon, a mixture of hydrogen/nitrogen and argon, a mixture of hydrogen and helium, or a mixture of oxygen and argon. Atmospheric plasma of the process gas(es) may be generated in the atmospheric plasma source. RF power may be applied to the atmospheric plasma source to generate plasma under atmospheric conditions. As used herein, "atmospheric plasma" may refer to plasma generated in a source such as a linear head under atmospheric conditions. The atmospheric plasma of the process gas(es) may include various radicals and ions of the process gas(es).

Compositions and concentrations of process gas(es) may be adjusted depending on the surface condition of the semiconductor substrate being treated. In some implementations, exposing the semiconductor substrate to atmospheric plasma includes exposing the semiconductor to the atmospheric plasma having a first gas composition, followed by exposing the semiconductor substrate to atmospheric plasma having a second gas composition. For instance, the first gas composition may include an oxygen plasma derived from an oxygen-containing gas and the second gas composition may include a hydrogen plasma derived from a hydrogen-containing gas. The oxygen plasma may remove impurities such as organic impurities and the hydrogen plasma may remove oxides. Other gas compositions may be used to treat various surface conditions. In some implementations, exposing the semiconductor substrate to atmospheric plasma includes exposing the semiconductor substrate to atmospheric plasma having a process gas flowed at a first flow rate, followed by exposing the semiconductor substrate to atmospheric plasma having the process gas flowed at a second flow rate. Adjusting flow rates or gas ratios may tune the aggressiveness of the atmospheric plasma.

The atmospheric plasma may be generated and applied to the semiconductor substrate without vacuum pumping or bringing the atmospheric plasma treatment station to a reduced pressure. The atmospheric plasma may be generated and applied in an enclosed controlled environment, where the controlled enclosed environment includes a positive pressure of non-reactive gas. Instead of exposing the atmospheric plasma treatment station to ambient conditions that may contain oxygen, the atmospheric plasma treatment station is free or substantially free of oxygen by flowing non-reactive gas through an enclosed space of the atmospheric plasma treatment station. The non-reactive gas may include nitrogen, helium, argon, krypton, xenon, or radon. The enclosed controlled environment of the atmospheric plasma treatments station may have an inert gas flow such as argon flow or nitrogen flow. The inert gas flow maintains the controlled environment to be free or substantially free of oxygen. As used herein, "substantially free of oxygen" may refer to a concentration of oxygen being less than about 0.1 vol. % in the controlled environment. The inert gas flow assists in preventing reoxidation on the surface of the semiconductor substrate.

An elevated temperature may be applied to the semiconductor substrate during exposure to the atmospheric pressure. The elevated temperature may be applied using one or more heating elements coupled to a substrate support that supports the semiconductor substrate. The elevated temperature may speed up the rate of reactions for treating the semiconductor substrate, thereby speeding up the scanning of the semiconductor substrate. For instance, the elevated temperature may speed up the rate of reducing oxides on the surface of the semiconductor substrate. In some implementations, the temperature maintained by the substrate support (e.g., hot plate) in the atmospheric plasma treatment station during exposure to the atmospheric plasma may be greater than about 50° C.

The surface of the semiconductor substrate is exposed to the atmospheric plasma to treat certain surface conditions or defects. The radicals, ions, and/or photons of the atmospheric plasma may react with the surface of the semiconductor substrate to perform one or more of the following: reduce oxides (e.g., reduce metal oxides to metal), remove organic impurities, change a hydrophobicity, change an electrical bias, and change a surface roughness of the semiconductor substrate. In some implementations, the atmospheric plasma serves to reduce oxides such as metal oxides. In some implementations, the atmospheric plasma serves to remove organic impurities. In some implementations, the atmospheric plasma serves to reduce oxides and remove organic impurities. In some implementations, the atmospheric plasma serves to render the surface more hydrophilic. In some implementations, the atmospheric plasma serves to adjust the adhesion properties of the surface to improve adhesion in subsequent deposition. In some implementations, the atmospheric plasma serves to adjust uniformity at the surface of the semiconductor substrate to improve plating uniformity.

By reducing oxides, the treatment reduces discontinuities and voids that may otherwise lead to non-uniform deposition/plating. By removing organic impurities, the treatment may increase conductivity at the surface of the semiconductor substrate to promote uniform deposition/plating and avoid contamination. By increasing a hydrophilicity of the substrate surface, contact angle is smaller to promote better wettability when contacting the substrate surface with a plating bath. Thus, effective treatment of the surface conditions and/or defects of the semiconductor substrate may be crucial for successful deposition or plating operations.

In some implementations, atmospheric plasma exposure may reduce oxide after treatment to less than 1% of an initial measurement of oxide. In some implementations, atmospheric plasma exposure may reduce contact angle by up to 80%, thereby increasing wettability of the surface of the semiconductor substrate. In some implementations, atmospheric plasma exposure may not cause damage to underlying materials and may increase roughness by less than 0.1%. In some implementations, substrates treated by atmospheric plasma exposure may yield up to a 50% increase in thickness of materials plated by electroless deposition compared to untreated substrates.

Certain regions of the semiconductor substrate may be exposed to the atmospheric plasma. Specifying the regions for exposure may be accomplished by positioning the atmospheric plasma source (e.g., linear head) over the semiconductor substrate, where one or both of the substrate support and the atmospheric plasma source are movable. In some implementations, the substrate support may be rotatable and/or translatable for positioning the semiconductor substrate. In some implementations, the atmospheric plasma source may be translatable along a track for positioning the atmospheric plasma source. The atmospheric plasma source may be coupled to the track, where the atmospheric plasma source may have at least two degrees of freedom in the x-y space. In some implementations, the atmospheric plasma source may have at least three degrees of freedom in the x-y-z space. Movement of the atmospheric plasma source and/or substrate support may be controlled by a controller associated with the semiconductor process tool of the atmospheric plasma treatment station.

The size of the atmospheric plasma source may provide exposure to relatively large regions of the semiconductor substrate, which can facilitate scanning of an entirety of the semiconductor substrate. In some instances, a linear head can have a diameter/width between about 100 mm and about 300 mm. Or, multiple linear heads can be lined up to increase exposure size. Since substrate diameters are often 200 mm, 300 mm, or 450 mm, the semiconductor substrate can be quickly scanned with appropriately sized linear head(s). An entire surface of the semiconductor substrate may be exposed to the atmospheric plasma by scanning the surface of the semiconductor substrate using the atmospheric plasma source. Different scan speeds may be used to scan the surface of the semiconductor substrate. For example, the atmospheric plasma source may scan the surface of the semiconductor substrate ranging from 1 mm/s to 500 mm/s or ranging from 10 mm/s to 300 mm/s. Faster scan speeds can reduce queue times for semiconductor fabrication. Larger scan areas can also reduce queue times for semiconductor fabrication. And as discussed above, elevated temperatures can also reduce queue times by enabling faster scan speeds. In some implementations, the design of the atmospheric plasma treatment station increases throughput by treating at least 30 substrates per hour, at least 50 substrates per hour, at least 60 substrates per hour, or at least 80 substrates per hour.

By way of illustration, a linear head having a width (measured along the y-direction) of 100 mm can scan a 300 mm substrate by scanning from 0 mm to 300 mm along the x-direction. Then the linear head or substrate support can be offset by 100 mm, and the scan can proceed along the x-direction from 300 mm to 0 mm. Then the linear head or substrate support can be offset by 100 mm, and the scan can be completed by proceeding along the x-direction from 0 mm to 300 mm.

In some implementations, prior to exposing the semiconductor substrate to atmospheric plasma, an indication can be received providing a surface condition of the semiconductor substrate. Specifically, the surface of the semiconductor substrate may be analyzed for its surface condition or surface defects prior to treatment. Measurements may be made to determine oxidation at the surface of the substrate. Measurements may also be made to determine the presence of organic impurities at the surface of the substrate. Measurements may alternatively or additionally be made of the semiconductor substrate's contact angle, electrical bias, or roughness. In some implementations, the composition and/or concentration of process gases to be delivered to the atmospheric plasma source is tuned based at least in part on the surface condition of the semiconductor substrate. Atmospheric plasma of the process gases is generated in the linear head, and the semiconductor substrate is exposed to the atmospheric plasma.

Figure 9B:
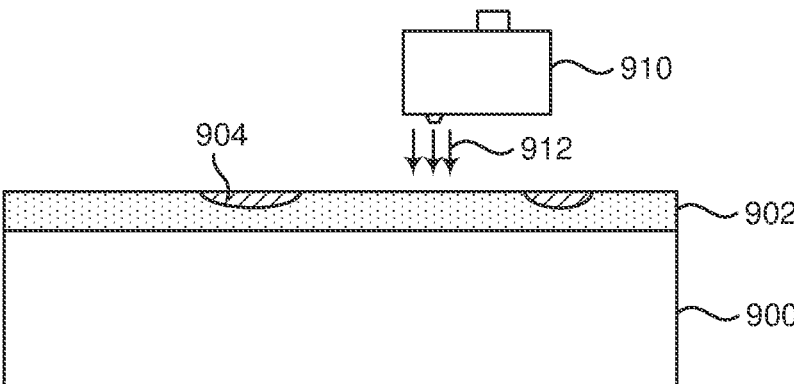

FIG. 9B shows a cross-sectional schematic illustration of the semiconductor substrate 900 of FIG. 9A after treatment using atmospheric plasma with process gases of a first composition. A linear head 910 is positioned over the surface of the semiconductor substrate 900. Process gases of a first composition are supplied to the linear head 910. The process gases of the first composition are ignited to generate an atmospheric plasma. Process gases enter the linear head 910 in molecular form and exit the linear head 910 as ions/radicals. The ions/radicals are discharged from the linear head 910 as a plasma beam 912. The plasma beam 912 generated from process gases of the first composition may remove the impurities 906 from the surface of the semiconductor substrate 900. The linear head 910 may scan across the surface of the semiconductor substrate 900. In some implementations, the process gases of the first composition include one or more oxygen-containing gases such as oxygen. An oxygen-based plasma may be effective in removing the impurities 906.

Figure 9C:
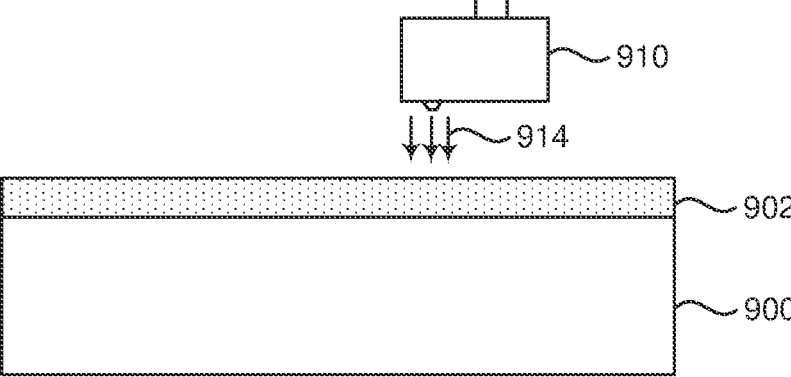

FIG. 9C shows a cross-sectional schematic illustration of the semiconductor substrate 900 of FIG. 9B after treatment using atmospheric plasma with process gases of a second composition. After removing impurities 906 from the surface of the semiconductor substrate 900, process gases of a second composition are supplied to the linear head 910. The process gases of the second composition are ignited to generate an atmospheric plasma. Plasma beam 914 is discharged from the linear head 910 to reduce oxides 904 from the surface of the semiconductor substrate 900. The linear head 910 may scan across the surface of the semiconductor substrate 900. In some implementations, the process gases of the second composition include one or more reducing gases such as hydrogen or forming gas. Reducing gases such as forming gas may be effective in removing the oxides 904.

As shown in FIGS. 9B and 9C, the linear head 910 may be flexible to adjust gas composition depending on treatment for the semiconductor substrate 900. The linear head 910 may also be flexible to adjust gas ratio mixtures depending on the treatment. For instance, the linear head 910 may be configured to remove impurities for a first scan and to remove oxides for a second scan. A gas ratio mixture, such as a flow rate ratio of $Ar:O_2$, can be adjusted to optimize organic removal efficiency. A gas ratio mixture, such as a flow rate ratio of $Ar:H_2$ can be adjusted to optimize reduction of oxides. In some implementations, the linear head 910 may be configured to render the surface of the semiconductor substrate 900 to be more hydrophobic or more hydrophilic. This can be done by using a process gas chemistry that adds/subtracts hydroxyl groups (—OH) from the surface of the semiconductor substrate 900.

Returning to FIG. 8, at block 820b of the process 800, the semiconductor substrate is transferred to the deposition chamber. The semiconductor substrate may be transferred relatively quickly and with minimal or no exposure to conditions that may oxidize or contaminate the semiconductor substrate. That way, the semiconductor substrate may be cleaned, treated, or otherwise prepared for subsequent deposition in the deposition chamber. In some implementations, a transfer time between exposure to atmospheric plasma and deposition may be between about 0.5 seconds and about 30 seconds or between about 1 second and about 10 seconds. This is significantly shorter than typical treatment or transfer units that interface with a deposition chamber. The transfer from the atmospheric plasma treatment station may take place without additional robot assemblies, load locks, cooling stations, or transfer stations. In other words, the atmospheric plasma treatment station may directly interface with the deposition chamber to facilitate transfer between the stations. This increases throughput, reduces queue time, and reduces the costs associated with maintenance and operation of additional equipment. In some implementations, transferring the semiconductor substrate includes moving the semiconductor substrate from the atmospheric plasma treatment station to the deposition chamber, which may be an electroless deposition chamber. In some cases, as the semiconductor substrate is being scanned by the linear head, the semiconductor substrate is already being transferred to the deposition chamber.

In some implementations, the semiconductor substrate may be cooled immediately after exposure to the atmospheric plasma. For instance, the semiconductor substrate may be cooled to a temperature less than about 50° C. (e.g., room temperature). In some implementations, the semiconductor substrate may be transferred under a blanket of inert gas species. Inert gas species (e.g., helium-nitrogen or argon-nitrogen) may continue to flow in the atmospheric plasma treatment station even after exposing the semiconductor substrate to atmospheric plasma. This can prevent reoxidation or recontamination of the semiconductor substrate between treatment and deposition. In some implementations, the inert gas species may be cooled to provide a cooling gas that lowers the temperature of the semiconductor substrate during transfer.

At block 830 of the process 800, metal is optionally electrodeposited on the semiconductor substrate. In some implementations, the metal is cobalt or copper. Electrodeposition may include either an electroplating or electroless plating operation. For example, plating the metal can include bulk deposition using a plating bath. Initiation and nucleation of metal by electroplating or electroless plating are promoted when a substrate surface is treated by atmospheric plasma. Greater amounts of deposition and more uniform deposition can occur with atmospheric plasma treatment prior to deposition. Though deposition may occur by electrodeposition at block 830 in an electroplating or electroless plating chamber, it will be understood that deposition can include any suitable deposition process in an appropriate deposition chamber. Furthermore, it will be understood that deposition at block 830 is not limited to metals but can include any conducting, semiconducting, or insulating materials.

Operations at blocks 810-830 may occur in the same semiconductor process tool or tool architecture. In some implementations, the semiconductor process tool is an electroless plating tool. The atmospheric plasma treatment station is integrated in the semiconductor process tool without adding to the tool's footprint or form factor. The atmospheric plasma treatment station may modify an existing station such as a transfer station or anneal station. Modifications to such stations may include adding a linear head, a track, one or more process gas lines for delivering process gases to the linear head, and one or more inert gas lines for delivering inert gas species to flow through the atmospheric plasma treatment station. In some implementations, modifications may further include adding one or more heater elements or replacing a substrate support with a hot plate for controlling substrate temperature during atmospheric plasma treatment.

Figure 9D:
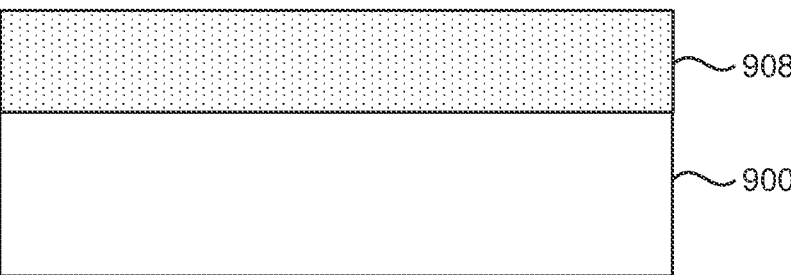

FIG. 9D shows a cross-sectional schematic illustration of the semiconductor substrate 900 of FIG. 9C after deposition of material on the surface of the semiconductor substrate 900. Bulk deposition of material 908 may be performed by any suitable deposition process such as PVD, CVD, ALD, electroplating, or electroless plating. In some implementations, the material 908 is a metal such as copper or cobalt. The material 908 may be deposited on the seed layer 902 after treatment. Atmospheric plasma treatment may promote uniform plating in electroplating or electroless plating processes.

Other Embodiments

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus for processing semiconductor substrates, the apparatus comprising:
   one or more cassettes for receiving a semiconductor substrate;
   a deposition chamber for depositing materials on the semiconductor substrate; and
   an atmospheric plasma treatment station for exposing the semiconductor substrate to an atmospheric plasma prior to deposition in the deposition chamber, wherein the atmospheric plasma treatment station comprises:
      an enclosed controlled environment for receiving the semiconductor substrate, the enclosed controlled environment having an inert gas flow;
      a track positioned above the semiconductor substrate within the enclosed controlled environment; and
      a linear head movable along the track, wherein the linear head is configured to direct the atmospheric plasma to specified regions of the semiconductor substrate.

2. The apparatus of claim 1, wherein the atmospheric plasma treatment station further comprises a substrate support having one or more heating elements for heating the semiconductor substrate.

3. The apparatus of claim 2, wherein the semiconductor substrate is heated to a temperature greater than about 50° C. during exposure to the atmospheric plasma.

4. The apparatus of claim 1, further comprising:
   one or more gas lines for supplying one or more process gases to the linear head; and
   an RF power supply for generating an atmospheric plasma of the one or more process gases in the linear head.

5. The apparatus of claim 4, wherein the one or more process gases include oxygen, hydrogen, water, nitrogen, ammonia, hydrazine, carbon monoxide, carbon dioxide, diborane, methane, carbon tetrafluoride, octafluorobutane, nitrogen trifluoride, sulfur hexafluoride, helium, argon, neon, krypton, xenon, radon, or combinations thereof.

6. The apparatus of claim 1, further comprising:
   a controller configured with instructions for performing the following operations:
      scan an entirety of a surface of the semiconductor substrate with the atmospheric plasma; and
      transfer the semiconductor substrate from the atmospheric plasma treatment station to the deposition chamber in reduced queue time.

7. The apparatus of claim 6, wherein the controller configured with instructions to scan the entirety of the surface of the semiconductor substrate is configured with instructions to perform the following operations:
   expose the semiconductor substrate to the atmospheric plasma having a first gas composition; and
   expose the semiconductor substrate to the atmospheric plasma having a second gas composition.

8. The apparatus of claim 7, wherein the atmospheric plasma having the first gas composition includes an oxygen plasma, and wherein the atmospheric plasma having the second gas composition includes a hydrogen plasma.

9. The apparatus of claim 6, wherein the controller is further configured with instructions to perform the following operations:
   expose the semiconductor substrate to the atmospheric plasma to perform one of the following: reduce metal oxides to metal on the semiconductor substrate, remove organic impurities on the semiconductor substrate, change a wettability of the semiconductor substrate, change an adhesion of the surface of the semiconductor substrate, and change a surface roughness of the semiconductor substrate.

10. The apparatus of claim 1, wherein the semiconductor substrate is supported on a movable substrate support, wherein the linear head is configured to scan a surface of the semiconductor substrate with the atmospheric plasma by moving the semiconductor substrate using the movable substrate support.

11. The apparatus of claim 1, wherein the linear head is configured to scan a surface of the semiconductor substrate with the atmospheric plasma by moving the linear head along the track.

12. The apparatus of claim 1, wherein the inert gas flow includes an inert gas species of nitrogen, helium, argon, neon, krypton, xenon, radon, or combinations thereof.

13. The apparatus of claim 1, wherein the deposition chamber is an electroless deposition chamber.

14. The apparatus of claim 1, wherein the enclosed controlled environment is an oxygen-free environment, and wherein the enclosed controlled environment is free of exposure to vacuum pressures.

15. The apparatus of claim 1, further comprising:
   one or more gas lines for delivering one or more process gases to the linear head; and
   a controller configured with instructions for performing the following operations:
      receive an indication providing a surface condition of the semiconductor substrate;
      adjust a gas composition of the one or more process gases to be delivered to the linear head;
      generate the atmospheric plasma of the one or more process gases in the linear head; and
      scan the semiconductor substrate by exposure to the atmospheric plasma to treat the surface condition of the semiconductor substrate prior to deposition in the deposition chamber.

16. A method of treating a surface condition of a semiconductor substrate with an atmospheric plasma, the method comprising:

receiving a semiconductor substrate in a semiconductor process tool including an atmospheric plasma treatment station and a deposition chamber; and transferring the semiconductor substrate to the deposition chamber, wherein transferring the semiconductor substrate to the deposition chamber includes:

exposing the semiconductor substrate to an atmospheric plasma in the atmospheric plasma treatment station prior to deposition in the deposition chamber, wherein the atmospheric plasma treatment station includes an enclosed controlled environment having an inert gas flow, a track positioned above the semiconductor substrate within the enclosed controlled environment, and a linear head movable along the track, wherein the linear head is configured to direct the atmospheric plasma to specified regions of the semiconductor substrate.

17. The method of claim 16, wherein transferring the semiconductor substrate to the deposition chamber includes moving the semiconductor substrate from the atmospheric plasma treatment station to an electroless deposition chamber.

18. The method of claim 16, further comprising:

receiving an indication providing a surface condition of the semiconductor substrate;

adjusting a gas composition of one or more process gases to be delivered to the linear head;

generating the atmospheric plasma of the one or more process gases in the linear head; and scanning the semiconductor substrate by exposure to the atmospheric plasma to treat the surface condition of the semiconductor substrate prior to deposition in the deposition chamber.

19. The method of claim 18, wherein the one or more process gases include oxygen, argon, hydrogen, nitrogen, ammonia, carbon monoxide, diborane, or combinations thereof, and wherein the inert gas flow includes an inert gas species of nitrogen, helium, argon, neon, krypton, xenon, radon, or combinations thereof.

20. He method of claim 16, wherein the enclosed controlled environment is an oxygen-free environment, and wherein the enclosed controlled environment is free of exposure to vacuum pressures.

* * * * *